(12) United States Patent
Hirose et al.

(10) Patent No.: US 9,455,137 B2
(45) Date of Patent: Sep. 27, 2016

(54) METHOD OF MANUFACTURING SEMICONDUCTOR DEVICE

(71) Applicant: HITACHI KOKUSAI ELECTRIC INC., Tokyo (JP)

(72) Inventors: Yoshiro Hirose, Toyama (JP); Yushin Takasawa, Toyama (JP); Tsukasa Kamakura, Toyama (JP); Yoshinobu Nakamura, Toyama (JP); Ryota Sasajima, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/864,167

(22) Filed: Sep. 24, 2015

(65) Prior Publication Data

US 2016/0013044 A1    Jan. 14, 2016

Related U.S. Application Data

(63) Continuation of application No. 13/345,885, filed on Jan. 9, 2012.

(30) Foreign Application Priority Data

Jan. 14, 2011   (JP) .................................. 2011-005638
Dec. 7, 2011    (JP) .................................. 2011-268002

(51) Int. Cl.
*H01L 21/02*      (2006.01)
*C23C 16/30*      (2006.01)
(Continued)

(52) U.S. Cl.
CPC ........... *H01L 21/0228* (2013.01); *C23C 16/30* (2013.01); *C23C 16/36* (2013.01);
(Continued)

(58) Field of Classification Search
CPC ................. H01L 21/28158; H01L 21/02126; H01L 21/02167; H01L 21/0217; H01L 21/02211; C23C 16/45531; C23C 16/45525
USPC ......................... 257/E21.192; 438/761, 478
See application file for complete search history.

(56) References Cited

U.S. PATENT DOCUMENTS 6,559,014 B1 *   5/2003   Jeon .................. H01L 21/28158
                                                         257/E21.192
7,312,128 B2    12/2007   Kim et al.
(Continued)

FOREIGN PATENT DOCUMENTS

JP     2006-13503  A     1/2006
JP     2008-227460 A     9/2008
(Continued)

OTHER PUBLICATIONS

JP Office Action, JP Application No. 2011-268002, Jul. 28, 2015, 3 pgs. (English translation provided).

*Primary Examiner* — Kenneth Parker
*Assistant Examiner* — Bo Fan
(74) *Attorney, Agent, or Firm* — Volpe and Koenig, P.C.

(57) ABSTRACT

An insulating film including characteristics such as low permittivity, a low etching rate and a high insulation property is formed. Supplying a gas containing an element, a carbon-containing gas and a nitrogen-containing gas to a heated substrate in a processing vessel to form a carbonitride layer including the element, and supplying the gas containing the element and an oxygen-containing gas to the heated substrate in the processing vessel to form an oxide layer including the element are alternately repeated to form on the substrate an oxycarbonitride film having the carbonitride layer and the oxide layer alternately stacked therein.

24 Claims, 11 Drawing Sheets

(51) Int. Cl.
  *C23C 16/36* (2006.01)
  *C23C 16/40* (2006.01)
  *C23C 16/455* (2006.01)

(52) U.S. Cl.
  CPC ............ *C23C 16/40* (2013.01); *C23C 16/401* (2013.01); *C23C 16/45523* (2013.01); *C23C 16/45529* (2013.01); *C23C 16/45531* (2013.01); *C23C 16/45546* (2013.01); *H01L 21/0217* (2013.01); *H01L 21/02112* (2013.01); *H01L 21/02126* (2013.01); *H01L 21/02167* (2013.01); *H01L 21/02211* (2013.01)

(56) References Cited

U.S. PATENT DOCUMENTS

| | | | |
|---|---|---|---|
| 7,351,668 B2 | 4/2008 | Chou et al. | |
| 7,468,311 B2 | 12/2008 | Dip et al. | |
| 7,501,355 B2 | 3/2009 | Bhatia et al. | |
| 7,507,676 B2 | 3/2009 | Chou et al. | |
| 7,625,609 B2 | 12/2009 | Matsuura | |
| 7,939,455 B2 | 5/2011 | Clark | |
| 8,043,907 B2 | 10/2011 | Ma et al. | |
| 8,119,210 B2 | 2/2012 | Narwankar et al. | |
| 8,298,915 B2 | 10/2012 | Aspar | |
| 2003/0215570 A1 | 11/2003 | Seutter et al. | |
| 2005/0287747 A1 | 12/2005 | Chakravarti et al. | |
| 2006/0281337 A1 | 12/2006 | Matsuura | |
| 2007/0032047 A1 | 2/2007 | Hasebe et al. | |
| 2007/0196977 A1 | 8/2007 | Wang et al. | |
| 2007/0240632 A1 | 10/2007 | Singh et al. | |
| 2008/0063791 A1 | 3/2008 | Hasebe et al. | |
| 2009/0170345 A1 | 7/2009 | Akae et al. | |
| 2010/0105192 A1* | 4/2010 | Akae | C23C 16/45525 438/478 |
| 2010/0130024 A1* | 5/2010 | Takasawa | C23C 16/45525 438/761 |
| 2010/0190348 A1 | 7/2010 | Akae et al. | |
| 2011/0076857 A1 | 3/2011 | Akae et al. | |

FOREIGN PATENT DOCUMENTS

| | | |
|---|---|---|
| JP | 2009-065203 A | 3/2009 |
| JP | 2010-153795 A | 7/2010 |
| JP | 2010-268007 A | 11/2010 |

* cited by examiner

METHOD OF MANUFACTURING SEMICONDUCTOR DEVICE

CROSS-REFERENCE TO RELATED PATENT APPLICATION

This U.S. non-provisional patent application is a continuation of U.S. patent application Ser. No. 13/345,885 filed on Jan. 9, 2012 and claims priority under 35 U.S.C. §119 of Japanese Patent Applications No. 2011-005638 filed on Jan. 14, 2011 and No. 2011-268002 filed on Dec. 7, 2011, in the Japanese Patent Office, the entire contents of which are hereby incorporated by reference.

BACKGROUND OF THE INVENTION

1. Field of the Invention

The present invention relates to a method of manufacturing a semiconductor device including a process of forming a thin film on a substrate, a method of processing a substrate and a substrate processing apparatus.

2. Description of the Related Art

A process of manufacturing a semiconductor device includes a process of forming a silicon insulating film such as a silicon oxide film (a $SiO_2$ film, hereinafter referred to as a SiO film) or a silicon nitride film (a $Si_3N_4$ film, hereinafter referred to as a SiN film) on a wafer such as a silicon wafer. Since the silicon oxide film has a good insulating property, low permittivity, etc., the silicon oxide film is widely used as an insulating film or an interlayer film. In addition, since the silicon nitride film is good in insulating property, corrosion resistance, permittivity, film stress controllability, etc., the silicon nitride film is widely used as an insulating film, a mask film, a charge accumulation film, or a stress control film. Further, a technique of adding carbon (C) to these insulating films is already known (for example, see Patent Document 1), and thus, etching resistance of the insulating film can be improved.

PRIOR ART DOCUMENT

[Patent Document 1] Japanese Patent Laid-open Publication No. 2005-268699

SUMMARY OF THE INVENTION

When carbon is added to insulating films, the etching resistance of the insulating films is improved, but permittivity is increased and leak resistance is deteriorated. That is, each of the insulating films has advantages and defects, but in the related art, there is no film having characteristics such as low permittivity, a low etching rate, and a high insulating property.

Accordingly, it is an aspect of the present invention to provide a method of manufacturing a semiconductor device, a method of processing a substrate and a substrate processing apparatus capable of forming an insulating film having low permittivity, a low etching rate, and a high insulating property.

According to one aspect, there is provided a method of manufacturing a semiconductor device, including: (a) supplying a gas containing an element, a carbon-containing gas and a nitrogen-containing gas to a heated substrate in a processing vessel to form a carbonitride layer including the element; (b) supplying the gas containing the element and an oxygen-containing gas to the heated substrate in the processing vessel to form an oxide layer including the element; and (c) alternately repeating the steps (a) and (b) to form on the substrate an oxycarbonitride film having the carbonitride layer and the oxide layer alternately stacked therein.

According to another embodiment of the present invention, there is provided a method of processing a substrate, including: (a) supplying a gas containing an element, a carbon-containing gas and a nitrogen-containing gas to a heated substrate in a processing vessel to form a carbonitride layer including the element; (b) supplying the gas containing the element and an oxygen-containing gas to the heated substrate in the processing vessel to form an oxide layer including the element; and (c) alternately repeating the steps (a) and (b) to form on the substrate an oxycarbonitride film having the carbonitride layer and the oxide layer alternately stacked therein.

According to still another aspect of the present invention, there is provided a substrate processing apparatus including: a processing vessel configured to accommodate a substrate; a heater configured to heat the substrate in the processing vessel; a element-containing gas supply system configured to supply a gas containing an element to the substrate in the processing vessel; a carbon-containing gas supply system configured to supply a carbon-containing gas to the substrate in the processing vessel; a nitrogen-containing gas supply system configured to supply a nitrogen-containing gas to the substrate in the processing vessel; an oxygen-containing gas supply system configured to supply an oxygen-containing gas to the substrate in the processing vessel; and a control unit configured to control the heater, the element-containing gas supply system, the carbon-containing gas supply system, the nitrogen-containing gas supply system and the oxygen-containing gas supply system to perform (a) supplying the gas containing the element, the carbon-containing gas and the nitrogen-containing gas to the heated substrate in the processing vessel to form a carbonitride layer including the element, (b) supplying the gas containing the element and the oxygen-containing gas to the heated substrate in the processing vessel to form an oxide layer including the element, and (c) alternately repeating (a) and (b) to form on the substrate an oxycarbonitride film having the carbonitride layer and the oxide layer alternately stacked therein.

According to the present invention, an insulating film having low permittivity, a low etching rate, and a high insulating property can be formed.

DETAILED DESCRIPTION OF THE PREFERRED EMBODIMENTS

Hereinafter, an embodiment of the present invention will be described with reference to the accompanying drawings.

(1) Configuration of Substrate Processing Apparatus

Figure 1:
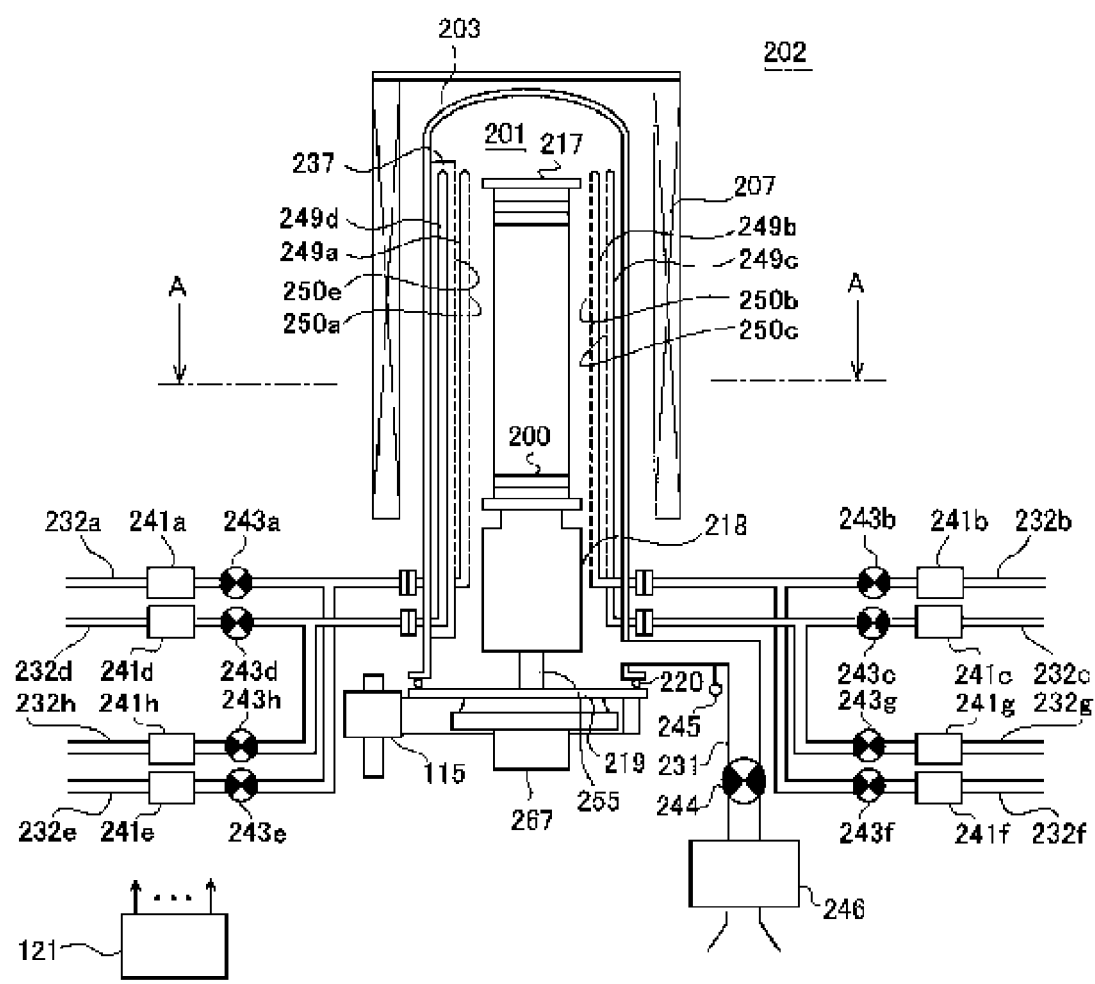
FIG. 1 is a schematic configuration view of a vertical processing furnace of a substrate processing apparatus exemplarily used in an embodiment, showing a longitudinal cross-sectional view of the processing furnace.
Figure 2:
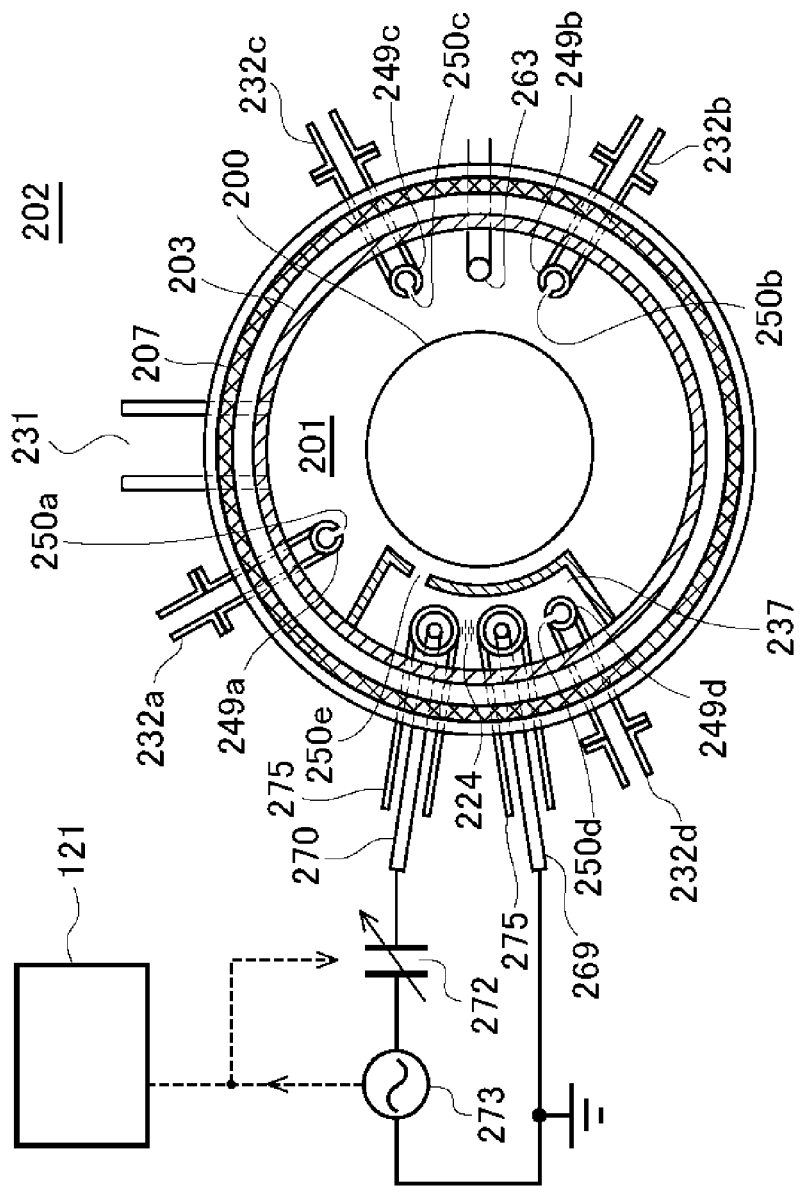
FIG. 2 is a schematic configuration view of the vertical processing furnace of the substrate processing apparatus exemplarily used in the embodiment, showing a cross-sectional view taken along line A-A of the processing furnace of FIG. 1.

FIG. 1 is a schematic configuration view of a vertical processing furnace of a substrate processing apparatus exemplarily used in an embodiment, showing a longitudinal cross-sectional view of the processing furnace 202, and FIG. 2 is a schematic configuration view of the vertical processing furnace of the substrate processing apparatus exemplarily used in the embodiment, showing a cross-sectional view taken along line A-A of the processing furnace 202 of FIG. 1.

As shown in FIG. 1, the processing furnace 202 includes a heater 207, which is a heating unit (a heating mechanism). The heater 207 having a cylindrical shape is supported and vertically installed by a heater base (not shown), which is a holding plate. In addition, the heater 207 functions as an activation mechanism configured to activate a gas using heat, as will be described later.

A reaction tube 203 constituting a reaction vessel (a processing vessel) is disposed inside the heater 207 to be concentric with the heater 207. The reaction tube 203 is formed of a heat-resistant material such as quartz ($SiO_2$) or silicon carbide (SiC), and has a cylindrical shape with an upper end closed and a lower end opened. A processing chamber 201 is formed in a hollow tubular portion of the reaction tube 203, and the processing chamber 201 is configured to accommodate wafers 200, which are substrates, using a boat 217, in a state in which the wafers 200 are disposed in a horizontal posture and arranged in a vertical direction in a multi-stage.

A first nozzle 249a, a second nozzle 249b, a third nozzle 249c and a fourth nozzle 249d are installed in the processing chamber 201 to pass through a lower portion of the reaction tube 203. A first gas supply pipe 232a, a second gas supply pipe 232b, a third gas supply pipe 232c and a fourth gas supply pipe 232d are connected to the first nozzle 249a, the second nozzle 249b, the third nozzle 249c and the fourth nozzle 249d, respectively. As described above, the four nozzles 249a, 249b, 249c and 249d and the four gas supply pipes 232a, 232b, 232c and 232d are installed in the reaction tube 203 to supply a plurality of kinds of gases, here, four kinds of gases, into the processing chamber 201.

In addition, a manifold (not shown) formed of a metal material and configured to support the reaction tube 203 may be installed under the reaction tube 203, and each of the nozzles may be installed to pass through a sidewall of the manifold. In this case, an exhaust pipe 231 (to be described later) may be further installed at the manifold formed of a metal material. In addition, even in this case, the exhaust pipe 231 may be installed at a lower portion of the reaction tube 203, rather than the manifold formed of the metal material. As described above, a furnace port part of the processing furnace 202 may be formed of a metal material, and the nozzles may be installed at the furnace port part formed of the metal material.

A mass flow controller (MFC) 241a, which is a flow rate control device (a flow rate control unit), and a valve 243a, which is an opening/closing valve, are installed at the first gas supply pipe 232a in sequence from an upstream side. In addition, a first inert gas supply pipe 232e is connected to the first gas supply pipe 232a at a downstream side of the valve 243a. An MFC 241e, which is a flow rate control device (a flow rate control unit), and a valve 243e, which is an opening/closing valve, are installed at the first inert gas supply pipe 232e in sequence from an upstream side. Further, the first nozzle 249a is connected to a front end of the first gas supply pipe 232a. The first nozzle 249a is vertically installed in an arc-shaped space between an inner wall of the reaction tube 203 and the wafer 200 from a lower portion to an upper portion of the inner wall of the reaction tube 203 upward in a stacking direction of the wafers 200. That is, the first nozzle 249a is disposed at a side of a wafer arrangement region, in which the wafers 200 are arranged, and installed at a region horizontally surrounding the wafer arrangement region along the wafer arrangement region. The first nozzle 249a is formed of an L-shaped long nozzle, and has a horizontal portion installed to pass through a lower sidewall of the reaction tube 203 and a vertical portion vertically installed from one end side to the other end side of at least the wafer arrangement region. A gas supply hole 250a configured to supply a gas is installed at a side surface of the first nozzle 249a. The gas supply hole 250a is opened toward a center of the reaction tube 203. A plurality of gas supply holes 250a are installed from a lower portion to an upper portion of the reaction tube 203, each of the gas supply holes 250a having the same opening area and installed at the same opening pitch. A first gas supply system is mainly constituted by the first gas supply pipe 232a, the MFC 241a, the valve 243a and the first nozzle 249a. In addition, a first inert gas supply system is mainly constituted by the first inert gas supply pipe 232e, the MFC 241e and the valve 243e.

An MFC 241b, which is a flow rate control device (a flow rate control unit) and a valve 243b, which is an opening/closing valve, are installed at the second gas supply pipe 232b in sequence from an upstream side. In addition, a second inert gas supply pipe 232f is connected to the second gas supply pipe 232b at a downstream side of the valve 243b. An MFC 241f, which is a flow rate control device (a flow rate control unit), and a valve 243f, which is an opening/closing valve, are installed at the second inert gas supply pipe 232f in sequence from an upstream side. In addition, the second nozzle 249b is connected to a front end of the second gas supply pipe 232b. The second nozzle 249b is vertically installed in the arc-shaped space between the inner wall of the reaction tube 203 and the wafer 200 from the lower portion to the upper portion of the inner wall of the reaction tube 203 upward in the stacking direction of the wafers 200. That is, the second nozzle 249b is disposed at a side of the wafer arrangement region, in which the wafers 200 are arranged, and installed at the region horizontally surrounding the wafer arrangement region along the wafer arrangement region. The second nozzle 249b is formed of an L-shaped long nozzle, and has a horizontal portion installed to pass through the lower sidewall of the reaction tube 203 and a vertical portion vertically installed from one end side to the other end side of at least the wafer arrangement region. A gas supply hole 250b configured to supply a gas is installed at a side surface of the second nozzle 249b. The gas supply hole 250b is opened toward the center of the reaction tube 203. A plurality of gas supply holes 250b are installed from the lower portion to the upper portion of the reaction tube 203, each of the gas supply holes 250*b* having the same opening area and installed at the same opening pitch. A second gas supply system is mainly constituted by the second gas supply pipe 232*b*, the MFC 241*b*, the valve 243*b* and the second nozzle 249*b*. In addition, a second inert gas supply system is mainly constituted by the second inert gas supply pipe 232*f*, the MFC 241*f* and the valve 243*f*.

An MFC 241*c*, which is a flow rate control device (a flow rate control unit), and a valve 243*c*, which is an opening/closing valve, are installed at the third gas supply pipe 232*c* in sequence from an upstream side. In addition, a third inert gas supply pipe 232*g* is connected to the third gas supply pipe 232*c* at a downstream side of the valve 243*c*. An MFC 241*g*, which is a flow rate control device (a flow rate control unit), and a valve 243*g*, which is an opening/closing valve, are installed at the third inert gas supply pipe 232*g* in sequence from an upstream side. Further, the third nozzle 249*c* is connected to a front end of the third gas supply pipe 232*c*. The third nozzle 249*c* is vertically installed in the arc-shaped space between the inner wall of the reaction tube 203 and the wafer 200 from the lower portion to the upper portion of the inner wall of the reaction tube 203 upward in the stacking direction of the wafers 200. That is, the third nozzle 249*c* is disposed at a side of the wafer arrangement region, in which the wafers 200 are arranged, and installed at the region horizontally surrounding the wafer arrangement region along the wafer arrangement region. The third nozzle 249*c* is formed of an L-shaped long nozzle, and has a horizontal portion installed to pass through the lower sidewall of the reaction tube 203 and a vertical portion vertically installed from one end side to the other end side of at least the wafer arrangement region. A gas supply hole 250*c* configured to supply a gas is installed at a side surface of the third nozzle 249*c*. The gas supply hole 250*c* is opened toward the center of the reaction tube 203. A plurality of gas supply holes 250*c* are installed from the lower portion to the upper portion of the reaction tube 203, each of the gas supply holes 250*b* having the same opening area and installed at the same opening pitch. A third gas supply system is mainly constituted by the third gas supply pipe 232*c*, the MFC 241*c*, the valve 243*c* and the third nozzle 249*c*. In addition, a third inert gas supply system is mainly constituted by the third inert gas supply pipe 232*g*, the MFC 241*g* and the valve 243*g*.

An MFC 241*d*, which is a flow rate control device (a flow rate control unit), and a valve 243*d*, which is an opening/closing valve, are installed at the fourth gas supply pipe 232*d* in sequence from an upstream side. In addition, a fourth inert gas supply pipe 232*h* is connected to the fourth gas supply pipe 232*d* at a downstream side of the valve 243*d*. An MFC 241*h*, which is a flow rate control device (a flow rate control unit), and a valve 243*h*, which is an opening/closing valve, are installed at the fourth inert gas supply pipe 232*h* in sequence from an upstream side. In addition, the fourth nozzle 249*d* is connected to a front end of the fourth gas supply pipe 232*d*. The fourth nozzle 249*d* is disposed in a buffer chamber 237, which is a gas distribution space.

The buffer chamber 237 is installed in an arc-shaped space between the inner wall of the reaction tube 203 and the wafer 200 from the lower portion to the upper portion of the inner wall of the reaction tube 203 in the stacking direction of the wafers 200. That is, the buffer chamber 237 is disposed at a side of the wafer arrangement region, in which the wafers 200 are arranged, and installed at the region horizontally surrounding the wafer arrangement region along the wafer arrangement region. A gas supply hole 250*e* configured to supply a gas is installed at an end of a wall of the buffer chamber 237 adjacent to the wafer 200. The gas supply hole 250*e* is opened toward the center of the reaction tube 203. A plurality of gas supply holes 250*e* are installed from the lower portion to the upper portion of the reaction tube 203, each of the gas supply holes 250*e* having the same opening area and installed at the same opening pitch.

The fourth nozzle 249*d* is vertically installed at an end opposite to an end of the buffer chamber 237, at which the gas supply hole 250*e* is installed, from the lower portion to the upper portion of the inner wall of the reaction tube 203 upward in the stacking direction of the wafers 200. That is, the fourth nozzle 249*d* is disposed at a side of the wafer arrangement region in which the wafers 200 are arranged, and installed at the region surrounding the wafer arrangement region along the wafer arrangement region. The fourth nozzle 249*d* is formed of an L-shaped long nozzle, and has a horizontal portion installed to pass through the lower sidewall of the reaction tube 203 and a vertical portion vertically installed from one end side to the other end side of at least the wafer arrangement region. A gas supply hole 250*d* configured to supply a gas is installed at a side surface of the fourth nozzle 249*d*. The gas supply hole 250*d* is opened toward the center of the buffer chamber 237. Similar to the gas supply holes 250*e* of the buffer chamber, a plurality of gas supply holes 250*d* are installed at the lower portion to the upper portion of the reaction tube 203. While the plurality of gas supply holes 250*d* may have the same opening area and the same opening pitch from the upstream side (the lower portion) to the downstream side (the upper portion) when a pressure difference between the insides of the buffer chamber 237 and the processing chamber 201 is small, the gas supply holes 250*d* may have opening areas increased from the upstream side to the downstream side or opening pitches reduced from the upstream side to the downstream side when the pressure difference is large.

In this embodiment, as the opening areas and the opening pitches of the gas supply holes 250*d* of the fourth nozzle 249*d* are adjusted from the upstream side to the downstream side as described above, first, while a gas passing through each of the gas supply holes 250*d* has a difference in a flow velocity, the gas having substantially the same flow rate is injected. In addition, the gas injected through each of the gas supply holes 250*d* is firstly introduced into the buffer chamber 237, and then, a difference in flow velocity of the gas in the buffer chamber 237 is uniformized.

That is, the gas injected into the buffer chamber 237 through each of the gas supply holes 250*d* of the fourth nozzle 249*d* has a particle speed attenuated in the buffer chamber 237, and then, is ejected into the processing chamber 201 through the gas supply holes 250*e* of the buffer chamber 237. Accordingly, the gas injected into the buffer chamber 237 through each of the gas supply holes 250*d* of the fourth nozzle 249*d* has a uniform flow rate and flow velocity when the gas is ejected into the processing chamber 201 through the gas supply holes 250*e* of the buffer chamber 237.

A fourth gas supply system is mainly constituted by the fourth gas supply pipe 232*d*, the MFC 241*d*, the valve 243*d*, the fourth nozzle 249*d* and the buffer chamber 237. In addition, in the fourth gas supply system, the buffer chamber 237 functions as a nozzle configured to supply a gas toward the wafer 200. Further, a fourth inert gas supply system is mainly constituted by the fourth inert gas supply pipe 232*h*, the MFC 241*h* and the valve 243*h*.

As described above, a gas supply method in the embodiment includes conveying a gas via the nozzles 249a, 249b, 249c and 249d and the buffer chamber 237 disposed in an arc-shaped longitudinally elongated space defined by the inner wall of the reaction tube 203 and ends of a plurality of stacked wafers 200, and firstly ejecting the gas into the reaction tube 203 adjacent to the wafers 200 through the gas supply holes 250a, 250b, 250c, 250d and 250e opened in the nozzles 249a, 249b, 249c and 249d and the buffer chamber 237. Here, a main flow of the gas in the reaction tube 203 is in a direction parallel to surfaces of the wafers 200, i.e., a horizontal direction. According to the above configuration, the gas can be uniformly supplied to each of the wafers 200, and a film thickness of a thin film formed on each of the wafers 200 can be uniformized. In addition, while a remaining gas after the reaction flows in a direction of an exhaust port, i.e., the exhaust pipe 231 (to be described later), the flow direction of the remaining gas is appropriately specified by a position of the exhaust port but not limited to the vertical direction.

A gas containing silicon (Si) (a silicon-containing gas) such as a silicon source gas is supplied into the processing chamber 201 through the first gas supply pipe 232a via the MFC 241a, the valve 243a and the first nozzle 249a. For example, hexachlorodisilane ($Si_2Cl_6$, abbreviation: HCD) gas may be used as the silicon-containing gas. In addition, when a liquid source material, which is in a liquid state at a room temperature under an atmospheric pressure, such as HCD is used, the liquid source material is evaporated by an evaporation system such as an evaporator or a bubbler to be supplied as a source gas.

A gas containing carbon (C) (a carbon-containing gas) is supplied into the processing chamber 201 through the second gas supply pipe 232b via the MFC 241b, the valve 243b and the second nozzle 249b. For example, propylene ($C_3H_6$) gas may be used as the carbon-containing gas. In addition, for example, a gas containing hydrogen (H) (a hydrogen-containing gas) may be supplied into the processing chamber 201 through the second gas supply pipe 232b via the MFC 241b, the valve 243b and the second nozzle 249b. For example, hydrogen ($H_2$) gas may be used as the hydrogen-containing gas.

For example, a gas containing nitrogen (N) (a nitrogen-containing gas) is supplied into the processing chamber 201 through the third gas supply pipe 232c via the MFC 241c, the valve 243c and the third nozzle 249c. For example, ammonia ($NH_3$) gas may be used as the nitrogen-containing gas.

For example, a gas containing oxygen (O) (an oxygen-containing gas) is supplied into the processing chamber 201 through the fourth gas supply pipe 232d via the MFC 241d, the valve 243d, the fourth nozzle 249d and the buffer chamber 237. For example, oxygen (02) gas may be used as the oxygen-containing gas. In addition, for example, boron (B), that is, a gas containing boron (B) (a boron-containing gas) may be supplied into the processing chamber 201 through the fourth gas supply pipe 232d via the MFC 241d, the valve 243d and the fourth nozzle 249d. For example, boron trichloride ($BCl_3$) gas or diborane ($B_2H_6$) gas may be used as the boron-containing gas.

For example, nitrogen ($N_2$) gas is supplied into the processing chamber 201 through the inert gas supply pipes 232e, 232f, 232g and 232h via the MFCs 241e, 241f, 241g and 241h, the valves 243e, 243f, 243g and 243h, the gas supply pipes 232a, 232b, 232c and 232d, the gas nozzles 249a, 249b, 249c and 249d, and the buffer chamber 237.

In addition, for example, when the above-described gases are flowed through the gas supply pipes, respectively, a source gas supply system, i.e., a silicon-containing gas supply system (a silane-based gas supply system), is constituted by the first gas supply system. In addition, a carbon-containing gas supply system or a hydrogen-containing gas supply system is constituted by the second gas supply system. Further, a nitrogen-containing gas supply system is constituted by the third gas supply system. Furthermore, an oxygen-containing gas supply system or a boron-containing gas supply system is constituted by the fourth gas supply system. In addition, the source gas supply system may be simply referred to as a source supply system. Further, when the carbon-containing gas, hydrogen-containing gas, nitrogen-containing gas, oxygen-containing gas and boron-containing gas are generally referred to as reaction gases, a reaction gas supply system is constituted by the carbon-containing gas supply system, the hydrogen-containing gas supply system, the nitrogen-containing gas supply system, the oxygen-containing gas supply system and the boron-containing gas supply system.

As shown in FIG. 2, a first rod-shaped electrode 269, which is a first electrode, and a second rod-shaped electrode 270, which is a second electrode, which have thin and long structures, are disposed in the buffer chamber 237 from the lower portion to the upper portion of the reaction tube 203 in the stacking direction of the wafers 200. Each of the first rod-shaped electrode 269 and the second rod-shaped electrode 270 is installed parallel to the fourth nozzle 249d. Each of the first rod-shaped electrode 269 and the second rod-shaped electrode 270 is covered and protected by an electrode protection tube 275, which is a protection pipe configured to protect each electrode from an upper portion to a lower portion thereof. One of the first rod-shaped electrode 269 and the second rod-shaped electrode 270 is connected to a high frequency power supply 273 via a matching box 272, and the other is connected to ground, which is a reference potential. As a result, plasma is generated in a plasma generating region 224 between the first rod-shaped electrode 269 and the second rod-shaped electrode 270. A plasma source, which is a plasma generator (a plasma generating unit) is mainly constituted by the first rod-shaped electrode 269, the second rod-shaped electrode 270, the electrode protection tube 275, the matching box 272, and the high frequency power supply 273. In addition, the plasma source functions as an activation mechanism configured to activate a gas using plasma, which will be described later.

The electrode protection tube 275 has a structure that can be inserted into the buffer chamber 237 in a state in which each of the first rod-shaped electrode 269 and the second rod-shaped electrode 270 is isolated from an atmosphere in the buffer chamber 237. Here, when the inside of the electrode protection tube 275 is the same atmosphere as the external air (atmospheric air), each of the first rod-shaped electrode 269 and the second rod-shaped electrode 270 inserted into the electrode protection tube 275 is oxidized by heat transferred from the heater 207. Accordingly, an inert gas purge mechanism configured to prevent oxidation of the first rod-shaped electrode 269 or the second rod-shaped electrode 270 by substantially suppressing an oxygen concentration to a low level by charging or purging an inert gas such as nitrogen is installed in the electrode protection tube 275.

The exhaust pipe 231 configured to exhaust the atmosphere in the processing chamber 201 is installed at the reaction tube 203. A vacuum pump 246, which is a vacuum exhaust apparatus, is connected to the exhaust pipe 231 via a pressure sensor 245, which is a pressure detector (a pressure detecting unit) configured to detect a pressure in the processing chamber 201, and an auto pressure controller (APC) valve 244, which is a pressure regulator (a pressure regulating unit). The APC valve 244 is an opening/closing valve configured to open/close the valve to perform vacuum exhaust/vacuum exhaust stoppage in the processing chamber 201 in a state in which the vacuum pump 246 is operated, and adjust a valve opening degree to regulate a pressure in the processing chamber 201 in a state in which the vacuum pump 246 is operated. The pressure in the processing chamber 201 may be vacuum-exhausted to a predetermined pressure (a vacuum level) by adjusting the valve opening degree of the APC valve 244 based on pressure information detected by the pressure sensor 245 while operating the vacuum pump 246. An exhaust system is mainly constituted by the exhaust pipe 231, the APC valve 244, the vacuum pump 246 and the pressure sensor 245.

A seal cap 219, which is a furnace port cover configured to hermetically seal a lower end opening of the reaction tube 203, is installed under the reaction tube 203. The seal cap 219 contacts a lower end of the reaction tube 203 from a lower side in a vertical direction thereof. The seal cap 219 is formed of a metal material such as stainless steel, and has a disc shape. An O-ring 220, which is a seal member in contact with the lower end of the reaction tube 203, is installed at an upper surface of the seal cap 219. A rotary mechanism 267 configured to rotate a boat is installed at the seal cap 219 opposite to the processing chamber 201. A rotary shaft 255 of the rotary mechanism 267 is configured to pass through the seal cap 219 to be connected to a boat 217 and rotate the boat 217 to rotate the wafers 200. The seal cap 219 is configured to be raised or lowered by a boat elevator 115, which is an elevation mechanism vertically installed at the outside of the reaction tube 203 in a vertical direction, and thus, the boat 217 can be loaded/unloaded into/from the inside of the processing chamber 201.

The boat 217, which is a substrate support, is formed of a heat resistant material such as quartz or silicon carbide, and configured to concentrically align the plurality of wafers 200 in a horizontal posture and support the wafers 200 in a multi-stage. In addition, an insulating member 218 formed of a heat resistant material such as quartz or silicon carbide is installed under the boat 217 so that heat from the heater 207 cannot be easily transferred toward the seal cap 219. In addition, the insulating member 218 may include a plurality of insulating plates formed of a heat resistant material such as quartz or silicon carbide, and an insulating plate holder configured to support the plates in a horizontal posture in a multi-stage.

A temperature sensor 263, which is a temperature detector, is installed in the reaction tube 203, and configured to adjust a conduction state to the heater 207 based on temperature information detected by the temperature sensor 263 such that the temperature in the processing chamber 201 reaches a predetermined temperature distribution. Similar to the nozzles 249a, 249b, 249c and 249d, the temperature sensor 263 has an L shape, and is installed along the inner wall of the reaction tube 203.

Figure 11:
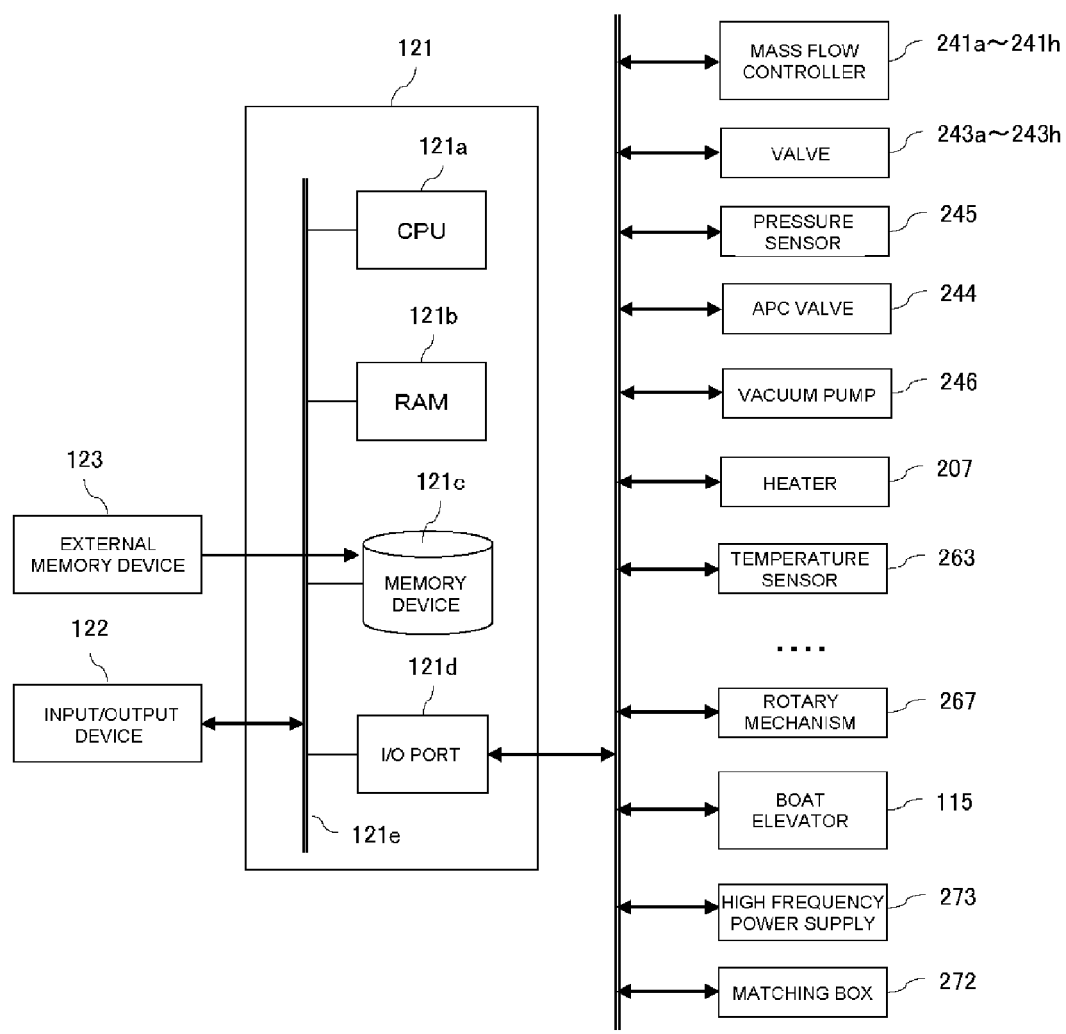
FIG. 11 is a schematic view of a controller of the substrate processing apparatus exemplarily used in the embodiment.

As shown in FIG. 11, a controller 121, which is a control unit (control means), is constituted by a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 constituted by, for example, a touch panel is connected to the controller 121.

The memory device 121c is constituted by, for example, a flash memory, a hard disk drive (HDD), and so on. A control program configured to control an operation of the substrate processing apparatus, or a process recipe in which sequences or conditions of substrate processing (to be described later) are recorded, is readably stored in the memory device 121c. In addition, the process recipe, which functions as a program, is combined to execute each sequence of the substrate processing process (to be described later) in the controller 121 and obtain a predetermined result. Hereinafter, the process recipe, the control program, or the like, is generally referred to as, simply, a program. In addition, in the specification, cases in which the word "program" is used may include cases in which the process recipe is solely included, the control program is solely included, or both of them are included. Further, the RAM 121b is constituted by a memory region (a work area) in which a program, data, etc. read by the CPU 121a is temporarily held.

The I/O port 121d is connected to the MFCs 241a, 241b, 241c, 241d, 241e, 241f, 241g and 241h, the valves 243a, 243b, 243c, 243d, 243e, 243f, 243g and 243h, the pressure sensor 245, the APC valve 244, the vacuum pump 246, the heater 207, the temperature sensor 263, the rotary mechanism 267, the boat elevator 115, the high frequency power supply 273, the matching box 272, and so on.

The CPU 121a is configured to read and perform the control program from the memory device 121c and read the process recipe from the memory device 121c in response to an input of an operation command from the input/output device 122. Then, according to contents of the read process recipe, the CPU 121a is configured to control flow rate adjusting operations of various gases by the MFCs 241a, 241b, 241c, 241d, 241e, 241f, 241g and 241h, opening/closing operations of the valves 243a, 243b, 243c, 243d, 243e, 243f, 243g and 243h, an opening/closing operation of the APC valve 244 and a pressure regulating operation based on the pressure sensor 245 by the APC valve 244, a temperature adjusting operation of the heater 207 based on the temperature sensor 263, starting/stoppage of the vacuum pump 246, a rotational velocity adjusting operation of the rotary mechanism 267, an elevation operation of the boat 217 by the boat elevator 115, power supply of the high frequency power supply 273, an impedance adjusting operation by the matching box 272, and so on.

The controller 121 is not limited to being constituted by an exclusive computer but may be constituted by a general-purpose computer. For example, an external memory device (for example, a magnetic tape, a magnetic disk such as a flexible disk or a hard disk, an optical disc such as CD or DVD, a magneto-optical disc such as MO, a semiconductor memory such as a USB memory or a memory card) 123, in which the program is stored, is prepared, and the program is installed on the general-purpose computer using the external memory device 123, configuring the controller 121 according to the embodiment. In addition, a unit for supplying a program to a computer is not limited to the case in which the program is supplied via the external memory device 123. For example, the program may be supplied using a communication unit such as the Internet or an exclusive line, rather than via the external memory device 123. Further, the memory device 121c or the external memory device 123 is constituted by a recording medium readable by the computer. Hereinafter, these may be generally referred to as, simply, a recording medium. Furthermore, in the specification, cases in which the phrase "recording medium" is used may include cases in which the memory device 121*c* is solely included, cases in which the external memory device 123 is solely included, or cases in which both of them are included.

(2) Substrate Processing Process

Hereinafter, as one process of manufacturing a semiconductor device using the processing furnace of the substrate processing apparatus, an example of a film-forming sequence of forming a silicon oxycarbonitride film (a SiOCN film), which is an insulating film, on a substrate will be described. In addition, in the following description, operations of parts constituting the substrate processing apparatus are controlled by the controller 121.

In the embodiment of the present invention, a process of supplying a silicon-containing gas, a carbon-containing gas and a nitrogen-containing gas to the heated wafer 200 in the processing vessel to form a silicon carbonitride layer (a SiCN layer) having a predetermined thickness, and a process of supplying a silicon-containing gas and an oxygen-containing gas to the heated wafer 200 in the processing vessel to form a silicon oxide layer (a SiO layer) having a predetermined thickness are alternately repeated to alternately stack the silicon carbonitride layer and the silicon oxide layer, forming a silicon oxycarbonitride film (a SiOCN film) having a predetermined thickness. In this embodiment, since the silicon carbonitride layer and the silicon oxide layer are alternately stacked on the wafer 200, such a film-forming method is referred to as a laminate method.

In addition, in a conventional chemical vapor deposition (CVD) method or an atomic layer deposition (ALD) method, for example, in the case of the CVD method, a plurality of kinds of gases including a plurality of elements constituting a film to be formed are simultaneously supplied, and in the case of the ALD method, a plurality of kinds of gases including a plurality of elements constituting a film to be formed are alternately supplied. Then, supply conditions such as a gas supply flow rate, a gas supply time, plasma power, etc. when a gas is supplied are controlled to form a $SiO_2$ film or a $Si_3N_4$ film. In these techniques, supply conditions are controlled such that a composition ratio of a film becomes O/Si≈2, which is a stoichiometric composition, for example, when the $SiO_2$ film is formed, and a composition ratio of a film becomes N/Si≈1.33, which is a stoichiometric composition, for example, when the $Si_3N_4$ film is formed.

Here, in the embodiment of the present invention, supply conditions are controlled such that a composition ratio of a film to be formed becomes a stoichiometric composition or another predetermined composition ratio different from the stoichiometric composition. For example, supply conditions are controlled such that at least one of the plurality of elements constituting the film to be formed is in excess of a stoichiometric composition in comparison with another element. Hereinafter, a sequence example of forming a film while controlling a ratio of a plurality of elements constituting the film to be formed, i.e., a composition ratio of the film, will be described.

(First Sequence)

Figure 3:
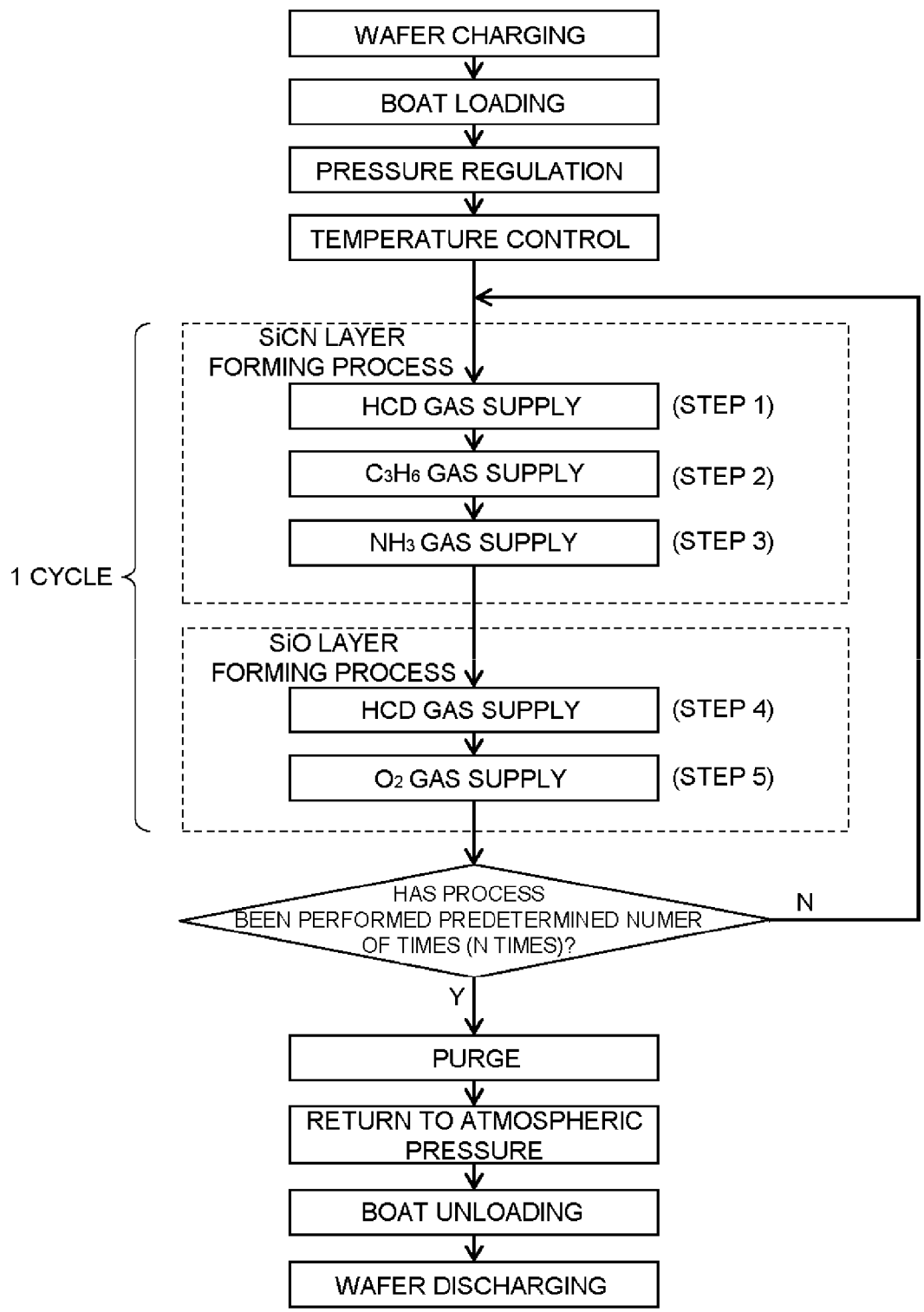
FIG. 3 is a view showing a film-forming flow in a first sequence of the embodiment.
Figure 4:
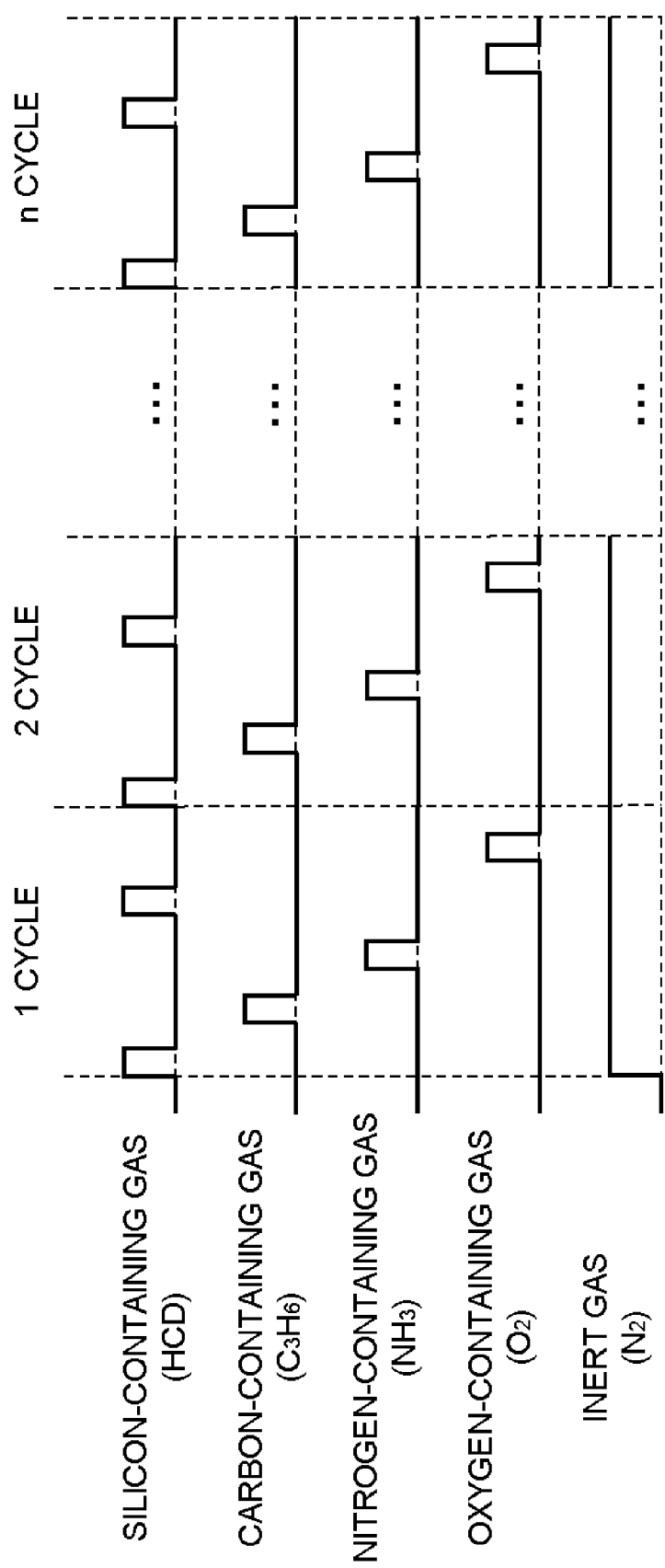
FIG. 4 is a view showing gas supply timing in the first sequence of the embodiment.

First, a first sequence of the embodiment will be described. FIG. 3 shows a film-forming flow in the first sequence of the embodiment. FIG. 4 shows gas supply timing in the first sequence of the embodiment.

In the first sequence of the embodiment, a process of supplying a silicon-containing gas to the heated wafer 200 in the processing vessel to form a silicon-containing layer, a process of supplying a carbon-containing gas on the heated wafer 200 in the processing vessel to form a carbon-containing layer on the silicon-containing layer to form a layer including silicon and carbon, a process of supplying a nitrogen-containing gas on the heated wafer 200 in the processing vessel to nitride the layer including silicon and carbon to form a silicon carbonitride layer (a SiCN layer), a process of supplying a silicon-containing gas on the heated wafer 200 in the processing vessel to form a silicon-containing layer, and a process of supplying an oxygen-containing gas on the heated wafer 200 in the processing vessel to oxidize the silicon-containing layer to form a silicon oxide layer (a SiO layer) are set as one cycle, and the cycle is performed a predetermined number of times (n times) to form a silicon oxycarbonitride film (a SiOCN film) having a predetermined film thickness formed by alternately stacking the silicon carbonitride layer and the silicon oxide layer on the wafer 200. In addition, in the first sequence of the embodiment, in any of the process of forming the silicon carbonitride layer and the process of forming the silicon oxide layer, a silicon-containing gas is supplied to the wafer 200 under a condition in which a CVD reaction occurs in the process of forming the silicon-containing layer.

Hereinafter, the first sequence of the embodiment will be described in detail. Here, an example of forming a silicon oxycarbonitride film (a SiOCN film), which is an insulating film, on the wafer 200, which is a substrate, through a film-forming sequence of FIGS. 3 and 4 using HCD gas, which is a silicon-containing gas, $C_3H_6$ gas, which is a carbon-containing gas, $NH_3$ gas, which is a nitrogen-containing gas, and $O_2$ gas, which is an oxygen-containing gas, will be described.

When the plurality of wafers 200 are charged into the boat 217 (wafer charging), as shown in FIG. 1, the boat 217 supporting the plurality of wafers 200 is raised by the boat elevator 115 to be loaded into the processing chamber 201 (boat loading). In this state, the seal cap 219 seals the lower end of the reaction tube 203 via the O-ring 220.

The inside of the processing chamber 201 is vacuum exhausted by the vacuum pump 246 to a desired pressure (a vacuum level). Here, the pressure in the processing chamber 201 is measured by the pressure sensor 245, and the APC valve 244 is feedback-controlled based on the measured pressure information (pressure regulation). In addition, the vacuum pump 246 always maintains an operation state until processing of at least the wafer 200 is terminated. Further, the inside of the processing chamber 201 is heated by the heater 207 to a desired temperature. Here, a conduction state to the heater 207 is feedback-controlled based on the temperature information detected by the temperature sensor 263 such that the inside of the processing chamber 201 reaches a desired temperature distribution (temperature adjustment). Next, rotation of the boat 217 and the wafer 200 is initiated by the rotary mechanism 267. Meanwhile, the rotation of the boat 217 and the wafer 200 by the rotary mechanism 267 is continuously performed until processing of the wafer 200 is terminated. Next, the following five steps are sequentially performed.

<SiCN Layer Forming Process>

[Step 1]

The valve 243*a* of the first gas supply pipe 232*a* is opened to flow HCD gas into the first gas supply pipe 232*a*. A flow rate of the HCD gas flowed in the first gas supply pipe 232*a* is controlled by the MFC 241*a*. The flow-rate-controlled HCD gas is supplied into the processing chamber 201 through the gas supply hole 250*a* of the first nozzle 249*a*, and exhausted through the exhaust pipe 231. Here, the valve 243e is simultaneously opened to flow an inert gas such as N₂ gas into the inert gas supply pipe 232e. A flow rate of the N₂ gas flowed in the inert gas supply pipe 232e is controlled by the MFC 241e. The flow-rate-controlled N₂ gas is supplied into the processing chamber 201 with the HCD gas and exhausted through the exhaust pipe 231.

At this time, the APC valve 244 is appropriately adjusted such that the pressure in the processing chamber 201 is within a range of, for example, 10 to 1,000 Pa. A supply flow rate of the HCD gas controlled by the MFC 241a is within a range of, for example, 10 to 1,000 sccm. A supply flow rate of N₂ gas controlled by the MFC 241e is within a range of, for example, 200 to 2,000 sccm. A time for which the wafer 200 is exposed to the HCD gas, i.e., a gas supply time (an irradiation time), is within a range of, for example, 1 to 120 seconds. Here, a temperature of the heater 207 is set to a temperature at which a CVD reaction is generated in the processing chamber 201, i.e., a temperature range of the wafer 200 of, for example, 300 to 650° C. In addition, when the temperature of the wafer 200 is less than 300° C., HCD cannot be easily adsorbed onto the wafer 200. Further, if the temperature of the wafer 200 exceeds 650° C., the CVD reaction is likely to be strong, which deteriorates uniformity. Accordingly, the temperature of the wafer 200 may have a range of 300 to 650° C.

A silicon-containing layer formed of, for example, less than one atomic layer to several atomic layers is formed on the wafer (200, a lower base film) by supply of the HCD gas. The silicon-containing layer may include an adsorption layer of the HCD gas or a silicon layer (a Si layer) of the HCD gas, or both of them. However, the silicon-containing layer may be a layer including silicon (Si) and chlorine (Cl). Here, a silicon layer is a generic term including a continuous layer configured by silicon (Si), a discontinuous layer, or a silicon thin film formed by overlapping the layers. In addition, a continuous layer configured by Si may be referred to as a silicon thin film. Further, Si constituting the silicon layer includes Si having a bonding to Cl that is not completely broken. Furthermore, the adsorption layer of the HCD gas includes a chemisorption layer in which a gas molecule of the HCD gas is continuous, and a discontinuous chemisorption layer. That is, the adsorption layer of the HCD gas includes a chemisorption layer of one molecule layer constituted by an HCD molecule or less than one molecule layer. In addition, the HCD (Si₂Cl₆) molecule constituting the adsorption layer of the HCD gas includes a molecule (a Si$_x$Cl$_y$ molecule) in which bonding between Si and Cl is partially broken. That is, the adsorption layer of the HCD gas includes a chemisorption layer in which a Si₂Cl₆ molecule and/or a Si$_x$Cl$_y$ molecule is continuous, or a discontinuous chemisorption layer. In addition, a layer of less than one atomic layer means an atomic layer which is discontinuously formed, and a layer of one atomic layer means an atomic layer which is continuously formed. Further, a layer of less than one molecule layer means a molecule layer which is discontinuously formed, and a layer of one molecule layer means a molecule layer which is continuously formed. Under a condition in which the HCD gas is self-decomposed (pyrolysis), i.e., under a condition in which a pyrolysis reaction of HCD occurs, Si is deposited on the wafer 200 to form a silicon layer. Under a condition in which the HCD gas is not self-decomposed (pyrolysis), i.e., under a condition in which a pyrolysis reaction of HCD does not occur, the HCD gas is adsorbed onto the wafer 200 to form an adsorption layer of the HCD gas. In addition, rather than forming the adsorption layer of the HCD gas on the wafer 200, formation of the silicon layer on the wafer 200 may increase a thin-film forming rate. When a thickness of the silicon-containing layer formed on the wafer 200 exceeds several atomic layers, action of nitridation in the following Step 3 does not reach the entire silicon-containing layer. Further, a minimum value of the silicon-containing layer that can be formed on the wafer 200 is less than one atomic layer. Accordingly, a thickness of the silicon-containing layer may be from less than one atomic layer to several atomic layers. Furthermore, when a thickness of the silicon-containing layer is one atomic layer or less, i.e., one atomic layer or less than one atomic layer, action of a nitridation reaction in the following Step 3 may be relatively increased to a reduction in time required for the nitridation reaction of Step 3. The time required to form the silicon-containing layer in Step 1 may be reduced. Eventually, since a processing time per one cycle can be reduced, a total processing time can also be reduced. That is, the film-forming rate can also be increased. In addition, when the thickness of the silicon-containing layer is one atomic layer or less, controllability of film thickness uniformity can be increased.

After the silicon-containing layer is formed, supply of the HCD gas is stopped. Here, in a state in which the APC valve 244 of the exhaust pipe 231 is open, the inside of the processing chamber 201 is vacuum exhausted by the vacuum pump 246 to eliminate gases remaining in the processing chamber 201 such as non-reacted HCD gas. In addition, here, the valve 243e is kept open, and supply of N₂ gas into the processing chamber 201 is maintained. Accordingly, an elimination of the gases remaining in the processing chamber 201 is facilitated.

As the silicon-containing gas, in addition to hexachlorodisilane (Si₂Cl₆, abbreviation: HCD) gas, not only an inorganic source such as tetrachlorosilane, i.e., silicon tetrachloride (SiCl₄, abbreviation: STC) gas, trichlorosilane (SiHCl₃, abbreviation: TCS) gas, dichlorosilane (SiH₂Cl₂, abbreviation: DCS) gas, monochlorosilane (SiH₃Cl, abbreviation: MCS) gas, and monosilane (SiH₄) gas, but also an organic source such as aminosilane-based tetrakisdimethylaminosilane (Si[N(CH₃)₂]₄, abbreviation: 4DMAS) gas, trisdimethylaminosilane (Si[N(CH₃)₂]₃H, abbreviation: 3DMAS) gas, bisdiethylaminosilane (Si[N(C₂H₅)₂]₂H₂, abbreviation: 2DEAS) gas, bistertiarybutylaminosilane (SiH₂[NH(C₄H₉)]₂, abbreviation: BTBAS) gas, and hexamethyldisilazane ((CH₃)₃SiNHSi(CH₃)₃, abbreviation: HMDS) gas may be used. As an inert gas, in addition to N₂ gas, a rare gas such as Ar gas, He gas, Ne gas, and Xe gas may be used.

[Step 2]

After Step 1 is terminated and the remaining gas in the processing chamber 201 is removed, the valve 243b of the second gas supply pipe 232b is opened to flow C₃H₆ gas into the second gas supply pipe 232b. A flow rate of the C₃H₆ gas flowed in the second gas supply pipe 232b is controlled by the MFC 241b. The flow-rate-controlled C₃H₆ gas is supplied into the processing chamber through the gas supply hole 250b of the second nozzle 249b and exhausted through the exhaust pipe 231. In addition, the C₃H₆ gas supplied into the processing chamber 201 is activated by heat. Here, the valve 243f is simultaneously opened to flow N₂ gas into the inert gas supply pipe 232f. The N₂ gas is supplied into the processing chamber 201 with the C₃H₆ gas, and exhausted through the exhaust pipe 231.

Here, the APC valve 244 is appropriately adjusted such that the pressure in the processing chamber 201 is within a range of, for example, 50 to 3,000 Pa. The supply flow rate of the C₃H₆ gas controlled by the MFC 241b is within a range of, for example, 100 to 10,000 sccm. The supply flow rate of the N₂ gas controlled by the MFC 241f is within a range of, for example, 200 to 2,000 sccm. Here, a partial pressure of the $C_3H_6$ gas in the processing chamber 201 is within a range of 6 to 2,940 Pa. A time for which the wafer 200 is exposed to the $C_3H_6$ gas, i.e., a gas supply time (an irradiation time), is within a range of, for example, 1 to 120 seconds. Similar to Step 1, the temperature of the heater 207 at this time is set such that the temperature of the wafer 200 is within a range of 300 to 650° C. In addition, activating the $C_3H_6$ gas by heat enables soft reaction and facilitates the formation of a carbon-containing layer (to be described later).

Here, the gas flowing into the processing chamber 201 is a thermally activated $C_3H_6$ gas, and the HCD gas does not flow in the processing chamber 201. Accordingly, the $C_3H_6$ gas is supplied to the wafer 200 in an activated state in which no gas phase reaction occurs, and at this time, a carbon-containing layer of less than one atomic layer, i.e., a discontinuous carbon-containing layer, is formed on the silicon-containing layer formed on the wafer 200 in Step 1. Accordingly, a second layer including silicon and carbon is formed. In addition, according to conditions, a portion of the silicon-containing layer may be reacted with the $C_3H_6$ gas to modify (carbonize) the silicon-containing layer to form a second layer including silicon and carbon.

The carbon-containing layer formed on the silicon-containing layer may be a carbon layer (a C layer), or a chemisorption layer of the carbon-containing gas (a $C_3H_6$ gas), i.e., a chemisorption layer of a material ($C_xH_y$) decomposed from $C_3H_6$. Here, the carbon layer should be a discontinuous layer formed by carbon. In addition, the chemisorption layer of $C_xH_y$ should be a chemisorption layer in which a $C_xH_y$ molecule is discontinuous. Further, when the carbon-containing layer formed on the silicon-containing layer is a continuous layer, for example, when an adsorption state of $C_xH_y$ onto the silicon-containing layer is in a saturation state, and a continuous chemisorption layer of $C_xH_y$ on the silicon-containing layer is formed, a surface of the silicon-containing layer is entirely covered by the chemisorption layer of $C_xH_y$. In this case, as silicon is not present on a surface of the second layer, a nitridation reaction of the second layer in Step 3 (to be described later) becomes difficult. This is because nitrogen is bonded to silicon but is not bonded to carbon. In order to cause the nitridation reaction desired in Step 3 (to be described later), an adsorption state of $C_xH_y$ onto the silicon-containing layer is in an unsaturated state, and silicon should be exposed to the surface of the second layer.

In addition, in order to change the adsorption state of $C_xH_y$ onto the silicon-containing layer to the unsaturated state, the processing conditions in Step 2 may be the above-mentioned processing conditions. However, when the processing conditions in Step 2 are replaced with the following processing conditions, the adsorption state of $C_xH_y$ onto the silicon-containing layer can be easily changed to the unsaturated state.

Wafer temperature: 500 to 630° C.
Pressure in processing chamber: 133 to 2,666 Pa
$C_3H_6$ gas partial pressure: 67 to 2,515 Pa
$C_3H_6$ gas supply flow rate: 1,000 to 5,000 sccm
$N_2$ gas supply flow rate: 300 to 1,000 sccm
$C_3H_6$ gas supply time: 6 to 100 seconds After that, the valve 243b of the second gas supply pipe 232b is closed to stop supply of the $C_3H_6$ gas. Here, in a state in which the APC valve 244 of the exhaust pipe 231 is open, the inside of the processing chamber 201 is vacuum exhausted by the vacuum pump 246 to eliminate gases remaining in the processing chamber 201 such as the non-reacted $C_3H_6$ gas and reaction byproducts remaining in the processing chamber 201. In addition, here, the valve 243f is kept open, and supply of $N_2$ gas into the processing chamber 201 is maintained. Accordingly, eliminations of the gases remaining in the process chamber 201 and the reaction byproducts remaining in the processing chamber 201 are facilitated.

As the carbon-containing gas, in addition to propylene ($C_3H_6$) gas, acetylene ($C_2H_2$) gas, ethylene ($C_2H_4$) gas, or the like may be used.

[Step 3]

After removing the remaining gas in the processing chamber 201, the valve 243c of the third gas supply pipe 232c is opened to flow $NH_3$ gas into the third gas supply pipe 232c. A flow rate of the $NH_3$ gas flowed in the third gas supply pipe 232c is controlled by the MFC 241c. The flow-rate-controlled $NH_3$ gas is supplied into the processing chamber 201 through the gas supply hole 250c of the third nozzle 249c and exhausted through the exhaust pipe 231. In addition, the $NH_3$ gas supplied into the processing chamber 201 is activated by heat. At this time, the valve 243g is simultaneously opened to flow $N_2$ gas into the inert gas supply pipe 232g. The $N_2$ gas is supplied into the processing chamber 201 with the $NH_3$ gas and exhausted through the exhaust pipe 231.

When the $NH_3$ gas is activated by heat and flowed, the APC valve 244 is appropriately adjusted such that the pressure in the processing chamber 201 is within a range of, for example, 50 to 3,000 Pa. A supply flow rate of the $NH_3$ gas controlled by the MFC 241c is within a range of, for example, 100 to 10,000 sccm. A supply flow rate of the $N_2$ gas controlled by the MFC 241g is within a range of, for example, 200 to 2,000 sccm. Here, a partial pressure of the $NH_3$ gas in the processing chamber 201 is within a range of 6 to 2,940 Pa. A time for which the wafer 200 is exposed to the $NH_3$ gas, i.e., a gas supply time (an irradiation time), is within a range of, for example, 1 to 120 seconds. The temperature of the heater 207 at this time is set such that the temperature of the wafer 200 is within a range of 300 to 650° C., similar to Step 1. Since $NH_3$ gas has a high reaction temperature and cannot be easily reacted at the above-mentioned wafer temperature, the pressure in the processing chamber 201 becomes a relatively high pressure as described above to enable thermal activation. In addition, thermal activation and supply of the $NH_3$ gas can cause a soft reaction, and nitridation (to be described later) can be softly performed.

The gas flowing into the processing chamber 201 is the thermally activated $NH_3$ gas, and neither HCD gas nor $C_3H_6$ gas flows in the processing chamber 201. Accordingly, the $NH_3$ gas does not cause a gas phase reaction, and the activated $NH_3$ gas reacts with a portion of the layer including silicon and carbon, which is the second layer formed on the wafer 200 in Step 2. As a result, the second layer is thermally nitrided with non-plasma, and changed (modified) to a third layer including silicon, carbon and nitrogen, i.e., a silicon carbonitride layer (a SiCN layer).

Here, the nitridation reaction of the second layer is set not to be saturated. For example, when a silicon layer of several atomic layers is formed in Step 1 and a carbon-containing layer of less than one atomic layer is formed in Step 2, a portion of a surface layer thereof (one atomic layer of the surface) is nitrided. That is, a portion of the region or the entire region in which nitridation of the surface layer can occur (a silicon-exposed region) is nitrided. In this case, the nitridation is performed under a condition in which the nitridation reaction of the second layer is unsaturated, so that the entire second layer is not nitrided. In addition, while several layers of the second layer below the surface layer may be nitrided according to conditions, only nitridation of the surface layer can improve controllability of the composition ratio of the silicon oxycarbonitride film. In addition, for example, even when a silicon layer of one atomic layer or less than one atomic layer is formed in Step 1 and a carbon-containing layer of less than one atomic layer is formed in Step 2, a portion of the surface layer is similarly nitrided. Even in this case, nitridation is performed under a condition in which the nitridation reaction of the second layer is unsaturated, so that the entire second layer is not nitrided.

In addition, in order for the nitridation reaction of the second layer to be unsaturated, the processing conditions in Step 3 may be the above-mentioned processing conditions. However, when the processing conditions in Step 3 are replaced with the following processing conditions, the nitridation reaction of the second layer can be easily unsaturated.

Wafer temperature: 500 to 630° C.
Pressure in processing chamber: 133 to 2,666 Pa
$NH_3$ gas partial pressure: 67 to 2,515 Pa
$NH_3$ gas supply flow rate: 1,000 to 5,000 sccm
$N_2$ gas supply flow rate: 300 to 1,000 sccm
$NH_3$ gas supply time: 6 to 100 seconds Next, the valve 243c of the third gas supply pipe 232c is closed to stop supply of the $NH_3$ gas. At this time, the APC valve 244 of the exhaust pipe 231 is kept open, and the inside of the processing chamber 201 is vacuum exhausted by the vacuum pump 246 to eliminate gases remaining in the processing chamber 201 such as the non-reacted $NH_3$ gas and reaction byproducts remaining in the processing chamber 201. In addition, here, the valve 243g is kept open, and supply of the $N_2$ gas into the processing chamber 201 is maintained. Accordingly, eliminations of the gases remaining in the process chamber 201 and the reaction byproducts remaining in the processing chamber 201 are facilitated.

As the nitrogen-containing gas, in addition to ammonia ($NH_3$) gas, diazine ($N_2H_2$) gas, hydrazine ($N_2H_4$) gas, $N_3H_8$ gas or the like may be used.

<SiO Layer Forming Process>
[Step 4]

After the remaining gas in the processing chamber 201 is removed, similar to Step 1, HCD gas is supplied into the processing chamber 201 and exhausted to form a silicon-containing layer, which is a fourth layer, on the SiCN layer (the third layer) formed on the wafer 200 in Step 3. After the silicon-containing layer is formed, similar to Step 1, supply of the HCD gas is stopped to remove the remaining gas in the processing chamber 201. In addition, the opening/closing operations of the valves, the processing conditions, the generated reactions, the formed layers, the remaining gas removal method, and the usable gases in Step 4 are similar to that in Step 1.

[Step 5]

After the remaining gas in the processing chamber 201 is removed, the valve 243d of the fourth gas supply pipe 232d and the valve 243h of the fourth inert gas supply pipe 232h are opened to flow $O_2$ gas into the fourth gas supply pipe 232d and to flow $N_2$ gas into the fourth inert gas supply pipe 232h. A flow rate of the $N_2$ gas flowed in the fourth inert gas supply pipe 232h is controlled by the MFC 241h. A flow rate of the $O_2$ gas flowed in the fourth gas supply pipe 232d is controlled by the MFC 241d. The flow-rate-controlled $O_2$ gas is mixed with the flow-rate-controlled $N_2$ gas in the fourth gas supply pipe 232d to be supplied into the buffer chamber 237 through the gas supply hole 250d of the fourth nozzle 249d. Here, no high frequency power is applied between the first rod-shaped electrode 269 and the second rod-shaped electrode 270. Accordingly, the $O_2$ gas supplied into the buffer chamber 237 is activated with heat, supplied into the processing chamber 201 toward the wafer 200 through the gas supply hole 250e, and exhausted through the exhaust pipe 231. In addition, here, high frequency power may be applied between the first rod-shaped electrode 269 and the second rod-shaped electrode 270 to activate the $O_2$ gas supplied into the buffer chamber 237 with plasma.

When the $O_2$ gas is activated with heat and flowed, the APC valve 244 is appropriately adjusted so that the pressure in the processing chamber 201 is within a range of, for example, 1 to 3,000 Pa. A supply flow rate of the $O_2$ gas controlled by the MFC 241d is within a range of, for example, 100 to 5,000 sccm (0.1 to 5 slm). A supply flow rate of the $N_2$ gas controlled by the MFC 241h is within a range of, for example, 200 to 2,000 sccm (0.2 to 2 slm). Here, a partial pressure of the $O_2$ gas in the processing chamber 201 is within a range of 6 to 2,940 Pa. A time for which the wafer 200 is exposed to the $O_2$ gas, i.e., a gas supply time (an irradiation time), is within a range of, for example, 1 to 120 seconds. A temperature of the heater 207 at this time is set such that the temperature of the wafer 200 is within a range of 300 to 650° C., similar to Steps 1 to 3. The $O_2$ gas is thermally activated under the same conditions as described above. In addition, as the $O_2$ gas is activated with heat and supplied, soft reaction can be generated and oxidation (to be described later) can be softly performed.

Here, the gas flowing into the processing chamber 201 is the thermally activated $O_2$ gas, and neither HCD gas, $C_3H_6$ gas nor $NH_3$ gas flows in the processing chamber 201. Accordingly, the $O_2$ gas does not cause a gas phase reaction, and the activated $O_2$ gas reacts with at least a portion of the silicon-containing layer (the fourth layer) formed on the SiCN layer (the third layer) formed in Step 4. Accordingly, the silicon-containing layer is thermally oxidized with non-plasma to be changed (modified) into a fifth layer including silicon and oxygen, i.e., a silicon oxide layer (a $SiO_2$ layer, hereinafter simply referred to as a SiO layer). Accordingly, a silicon oxycarbonitride layer (a SiOCN layer), in which the SiO layer is stacked on the SiCN layer, is formed. Here, the activated $O_2$ gas may be reacted with at least a portion of the silicon-containing layer, or may be reacted with at least a portion of the SiCN layer, which is an under layer thereof. That is, at least a portion of the SiCN layer, which is an under layer of the silicon-containing layer, may be thermally oxidized with non-plasma.

Here, an oxidation reaction of the silicon-containing layer is set to be unsaturated. For example, when the silicon layer of several atomic layers is formed in Step 4, at least a portion of the surface layer (one atomic layer of the surface) is oxidized. In this case, in order not to oxidize the entire silicon layer, oxidation is performed under a condition in which the oxidation reaction of the silicon layer is unsaturated. In addition, while several layers from the surface layer of the silicon layer may be oxidized according to conditions, only the surface layer may be oxidized to improve controllability of the composition ratio of the SiOCN film. In addition, for example, even when the silicon layer of one atomic layer or less than one atomic layer is formed in Step 4, similarly, a portion of the surface layer is oxidized. Even in this case, in order not to oxidize the entire silicon layer, oxidation is performed under a condition in which the oxidation reaction of the silicon layer is unsaturated. Here, even when at least a portion of the SiCN layer, which is an under layer of the silicon-containing layer, is oxidized, the oxidation reaction of the SiCN layer is set to be unsaturated. In this case, in order not to oxidize the entire SiCN layer, the oxidation is performed under a condition in which the oxidation reaction of the SiCN layer is unsaturated.

In addition, in order for the oxidation reaction of the silicon-containing layer (the fourth layer) or the SiCN layer (the third layer), which is an under layer thereof, to be unsaturated, the processing conditions in Step 5 may be the above-mentioned processing conditions. However, when the processing conditions in Step 5 are replaced with the following processing conditions, the oxidation reaction of the silicon-containing layer or the SiCN layer can be easily unsaturated.

Wafer temperature: 500 to 630° C.
Pressure in processing chamber: 133 to 2,666 Pa
$O_2$ gas partial pressure: 67 to 2,515 Pa
$O_2$ gas supply flow rate: 1,000 to 5,000 sccm
$N_2$ gas supply flow rate: 300 to 1,000 sccm
$O_2$ gas supply time: 6 to 100 seconds Next, the valve 243d of the fourth gas supply pipe 232d is closed to stop supply of the $O_2$ gas. At this time, the APC valve 244 of the exhaust pipe 231 is kept open, and the inside of the processing chamber 201 is vacuum exhausted by the vacuum pump 246 to eliminate gases remaining in the processing chamber 201 such as non-reacted $O_2$ gas. Here, the valve 243h is kept open, and supply of the $N_2$ gas into the processing chamber 201 is maintained. Accordingly, an elimination of the gases remaining in the processing chamber 201 is facilitated.

As the oxygen-containing gas, in addition to the oxygen ($O_2$) gas, vapor ($H_2O$) gas, nitrogen oxide (NO) gas, nitrous oxide ($N_2O$) gas, nitrogen dioxide ($NO_2$) gas, carbon oxide (CO) gas, carbon dioxide ($CO_2$) gas, ozone ($O_3$) gas, $O_3$ gas+$H_2$ gas, $O_3$ gas+$H_2$ gas, and so on may be used.

Steps 1 to 5 (described above) are set as one cycle, and the cycle is performed a predetermined number of times (one time or more), so that the SiCN layer and the SiO layer can be alternately stacked on the wafer 200 to form a thin film having a predetermined film thickness and including silicon, carbon, nitrogen and oxygen, i.e., a silicon oxycarbonitride film (a SiOCN film). In addition, the above-mentioned cycle may be repeated a plurality of times.

In each step, as the pressure in the processing chamber 201 or the processing conditions of the gas supply time, and so on are controlled, a ratio of the respective elements, i.e., a silicon element, an oxygen element, a carbon element, and a nitrogen element in the SiOCN layer, i.e., a silicon concentration, an oxygen concentration, a carbon concentration, and a nitrogen concentration, can be adjusted to control the composition ratio of the SiOCN film.

In addition, here, as a thickness of at least one layer of the SiCN layer and the SiO layer is controlled, a composition ratio of the SiOCN film may be controlled. For example, when the SiCN layer having a thickness of several atomic layers and the SiO layer having a thickness of less than one atomic layer are alternately stacked, a ratio of the silicon element, the nitrogen element and the carbon element with respect to the oxygen element in the SiOCN film is controlled to be enriched (a ratio of the oxygen element becomes poor). In addition, for example, when the SiCN layer having a thickness of less than one atomic layer and the SiO layer having a thickness of several atomic layers are alternately stacked, a ratio of the silicon element and the oxygen element with respect to the nitrogen element and the carbon element in the SiOCN film is controlled to be enriched (a ratio of the nitrogen element and the carbon element becomes poor). In addition, according to the processing conditions, the SiCN layer and the SiO layer, which are alternately stacked, may be diffused to each other.

When a film-forming processing of forming the SiOCN film having a predetermined film thickness and including a predetermined composition is performed, an inert gas such as $N_2$ is supplied into the processing chamber 201 and exhausted so that the inside of the processing chamber 201 is purged by the inert gas (purging). Next, the atmosphere in the processing chamber 201 is substituted with the inert gas (inert gas substitution), and the inside of the processing chamber 201 is returned to an atmospheric pressure (return to atmospheric pressure).

Next, in a state in which the seal cap 219 is lowered by the boat elevator 115 to open the lower end of the reaction tube 203 and the processed wafer 200 is supported by the boat 217, the boat 217 is unloaded to the outside of the reaction tube 203 from the lower end of the reaction tube 203 (boat unloading). Next, the processed wafer 200 is discharged from the boat 217 (wafer discharging).

Figure 5:
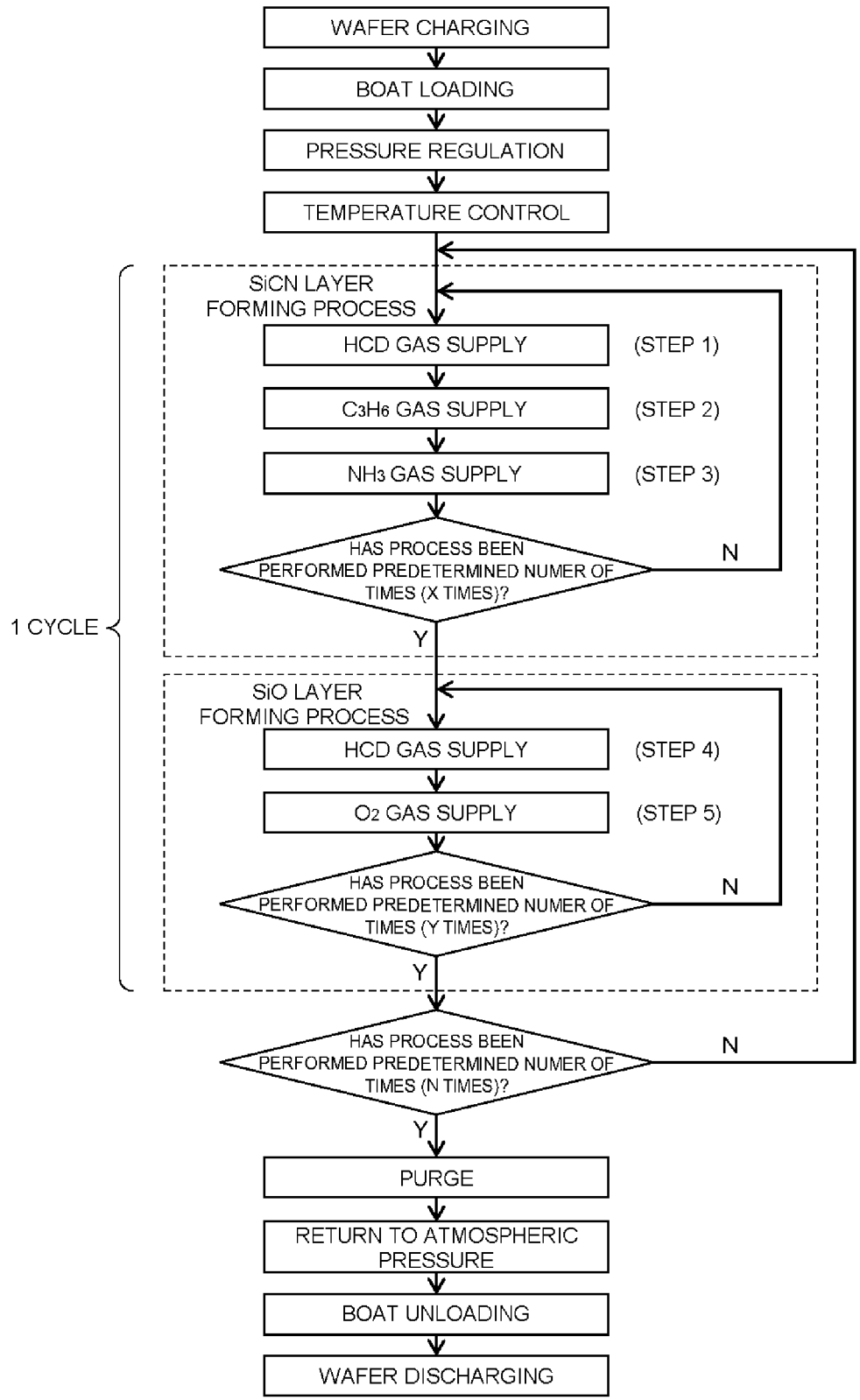
FIG. 5 is a view showing a film-forming flow in a second sequence of the embodiment.
Figure 6:
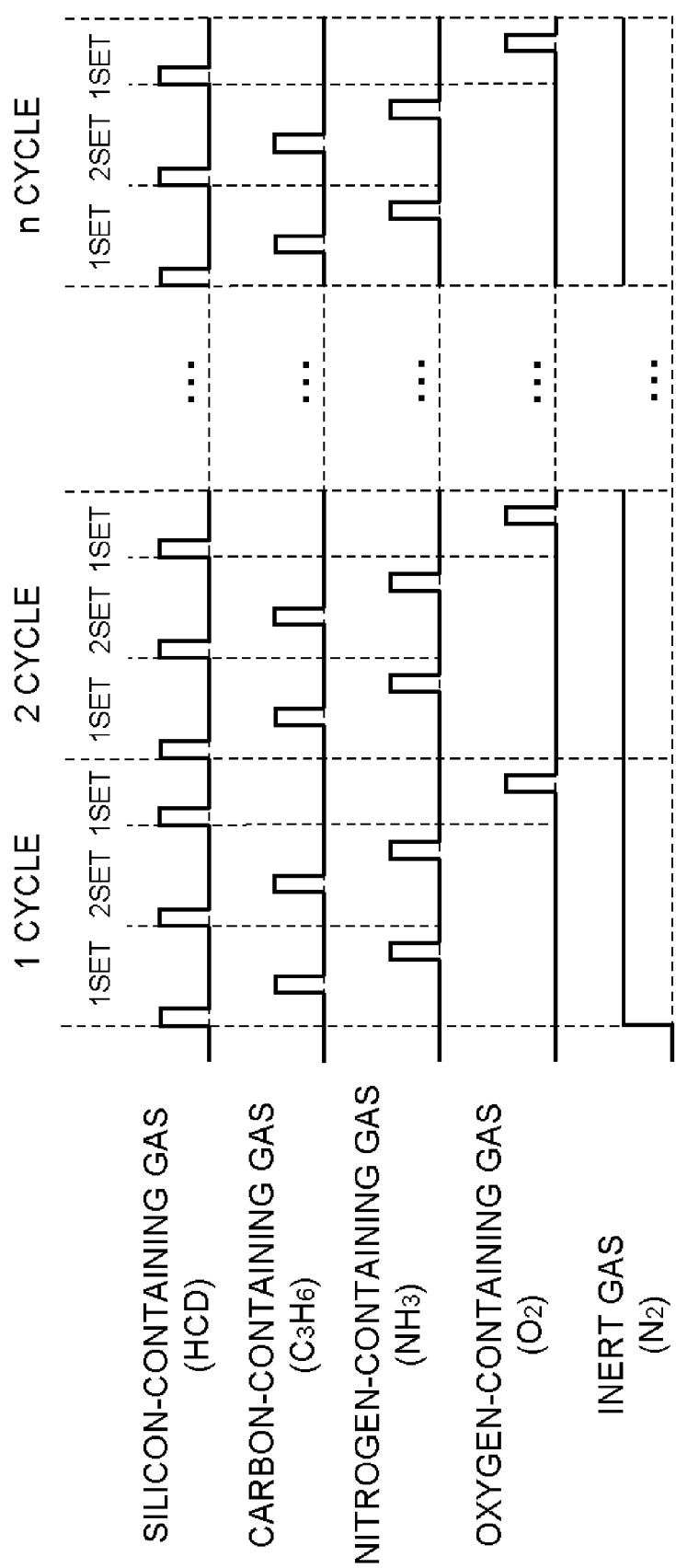
FIG. 6 is a view showing gas supply timing in the second sequence of the embodiment.

(Second Sequence) Hereinafter, a second sequence of the embodiment will be described. FIG. 5 is a view showing a film-forming flow in the second sequence of the embodiment. FIG. 6 is a view showing gas supply timing in the second sequence of the embodiment.

In the first sequence, the example in which Steps 1 to 5 (described above) are set as one cycle and the cycle is performed one time or more, and the SiCN layer of one layer and the SiO layer of one layer are alternately stacked on the wafer 200 to form the SiOCN film having a predetermined film thickness has been described.

Meanwhile, in the second sequence, a process of performing a first set including Steps 1 to 3 (described above) a predetermined number of times (one time or more) to form a SiCN layer having a predetermined thickness, and a process of performing a second set including Steps 4 and 5 a predetermined number of times (one time or more) to form a SiO layer having a predetermined thickness are set as one cycle, and the cycle is performed a predetermined number of times (one time or more), to form a SiOCN film having a predetermined thickness and formed by alternately stacking a SiCN layer of one layer or more and a SiO layer of one layer or more on the wafer 200. That is, in the second sequence, the SiCN layer of one layer or more, for example, several layers, and the SiO layer of one layer or more, for example, several layers, are alternately stacked on the wafer 200 to form the SiOCN film having a predetermined thickness.

More specifically, in the second sequence of the embodiment, a process in which a process of supplying a silicon-containing gas to the heated wafer 200 in the processing vessel to form a silicon-containing layer, a process of supplying a carbon-containing gas to the heated wafer 200 in the processing vessel to form a carbon-containing layer on the silicon-containing layer to form a layer including silicon and carbon, and a process of supplying a nitrogen-containing gas to the heated wafer 200 in the processing vessel to nitride the layer including silicon and carbon to form a silicon carbonitride layer are set as a first set of processes, and the first set is performed a predetermined number of times (x times) to form a silicon carbonitride layer (a SiCN layer) having a predetermined thickness; and a process in which a process of supplying a silicon-containing gas to the heated wafer 200 in the processing vessel to form a silicon-containing layer, and a process of supplying an oxygen-containing gas to the heated wafer 200 in the processing vessel to oxidize the silicon-containing layer to form a silicon oxide layer are set as a second set of processes, and the second set is performed a predetermined number of times (y times) to form a silicon oxide layer (a SiO layer) having a predetermined thickness; are set as one cycle, and the cycle is performed a predetermined number of times (n times) to form a silicon oxycarbonitride film (SiOCN film) having a predetermined thickness and formed by alternately stacking the silicon carbonitride layer and the silicon oxide layer on the wafer 200.

Even in this case, the above-mentioned cycle may be repeated a plurality of times. In addition, even in the second sequence of the embodiment, in any process of the process of forming the silicon carbonitride layer and the process of forming the silicon oxide layer, a silicon-containing gas is supplied to the wafer 200 under a condition in which a CVD reaction occurs, in the process of forming the silicon-containing layer.

In addition, the second sequence is distinguished from the first sequence in that the number of times (x) that the SiCN layer forming process is performed is different from the number of times (y) that the SiO layer forming process is performed, but the other operations are similar to the first sequence. That is, the opening/closing operations of the respective valves, processing conditions, generated reactions, formed layers, a remaining gas removal method, usable gases, and so on in the SiCN layer forming process and the SiO layer forming process in the second sequence are similar to those of the first sequence. Further, the wafer charging, boat loading, pressure regulation, temperature adjustment, wafer rotation, purging, inert gas substitution, return to atmospheric pressure, boat unloading, and wafer discharging in the second sequence are similarly performed in the first sequence. Furthermore, the case in which the number of times (x) that the SiCN layer forming process is performed and the number of times (y) that the SiO layer forming process is performed in the second sequence are each one time (x=1 and y=1) corresponds to the first sequence.

FIG. 6 shows an example in which Steps 1 to 3 (described above) are set as a first set, the first set is performed two times, Step 4 and 5 are set as a second set, the second set is performed one time, these are set as one cycle, and the cycle is performed n times, so that a SiCN layer of two layers and a SiO layer of one layer are alternately stacked on the wafer 200 to form a SiOCN film having a predetermined film thickness.

As described above, Steps 1 to 3 (to be described later) are set as a first set, the first set is performed a predetermined number of times (x times), Steps 4 and 5 are set as a second set, the second set is performed a predetermined number of times (y times), these are set as one cycle, and the cycle is performed a predetermined number of times (n times), so that a ratio of a silicon element, a carbon element and a nitrogen element with respect to an oxygen element or a ratio of a silicon element and an oxygen element with respect to a carbon element and a nitrogen element in a SiOCN film can be appropriately controlled, and controllability of a composition ratio of the SiOCN film can be further improved. For example, when a SiCN layer of five layers and a SiO layer of one layer are alternately stacked, a ratio of a silicon element, a nitrogen element and a carbon element with respect to an oxygen element in the SiOCN film can be controlled to be enriched (a ratio of the oxygen element becomes poor). In addition, for example, when a SiCN layer of one layer and a SiO layer of five layers are alternately stacked, a ration of a silicon element and an oxygen element with respect to a nitrogen element and a carbon element in a SiOCN film can be controlled to be enriched (a ratio of the nitrogen element and the carbon element becomes poor). That is, as a layer number of at least one of the SiCN layer and the SiO layer, i.e., a set number (x, y) is controlled, the composition ratio of the SiOCN film can be precisely controlled, and according to a combination of the set number (x, y), minute composition control in which a ratio of a certain element is a small amount (for example, several %) becomes possible. In addition, as each set number is increased, a layer number of the SiCN layer or the SiO layer formed in one cycle can be increased by the number of sets, a cycle rate can be improved, and a film-forming rate can also be improved.

(3) Effects According to the Embodiment

According to the embodiment, one or a plurality of effects described below are provided.

According to the embodiment, in the first sequence, since Steps 1 to 5 are set as one cycle and the cycle is performed a predetermined number of times to form the SiOCN film having a predetermined film thickness, the SiOCN film having a predetermined composition and a predetermined film thickness can be formed. In addition, in the second sequence, since Steps 1 to 3 are set as a first set, the first set is performed a predetermined number of times, Steps 4 and 5 are set as a second set, the second set is performed a predetermined number of times, these are set as one cycle, and the cycle is performed a predetermined number of times to form the SiOCN film having a predetermined film thickness, the SiOCN film having a predetermined composition and a predetermined film thickness can be formed.

In addition, according to the embodiment, rather than directly oxidizing the SiCN layer, since the SiCN layer and the SiO layer are alternately stacked to form the SiOCN layer through a laminate method, separation of C or N from the SiCN layer when the SiCN layer is directly oxidized can be prevented. That is, since a bonding force of Si—O bonding is stronger than that of Si—C bonding or Si—N bonding in the SiCN layer, when the SiCN layer is directly oxidized, during a process of forming the Si—O bonding, the Si—C bonding and the Si—N bonding in the SiCN layer may be broken, and C and N in which bonding to Si is broken may be separated. However, since deposition of the SiCN layer onto the wafer and deposition of the SiO layer onto the SiCN layer are alternately performed, and the SiCN layer and the SiO layer are alternately stacked to form the SiOCN layer, the SiOCN layer can be formed without directly oxidizing the SiCN layer, and separation of C and N from the SiCN layer can be prevented. Accordingly, a decrease in a C concentration or an N concentration in the SiOCN film can be prevented, controllability of the composition ratio control of the SiOCN film can be improved, and a composition ratio control window can be widened.

Further, in the embodiment, in Step 5, while oxidation processing with respect to a stacking film of the silicon-containing layer and the SiCN layer is performed, the silicon-containing layer formed on the SiCN layer in Step 4 is actively oxidized, and the silicon-containing layer functions as an oxidation blocking layer configured to block oxidation of the SiCN layer. Here, while at least a portion of the SiCN layer, which is an under layer of the silicon-containing layer, may be oxidized, even in this case, oxidation of the SiCN layer is suppressed by an oxidation blocking effect of the silicon-containing layer, an oxidation reaction of the SiCN layer can be easily unsaturated, and separation of C or N from the SiCN layer can be suppressed.

In addition, when the SiCN layer is directly oxidized, in order to suppress separation of C or N from the SiCN layer, oxidation of the SiCN layer by the oxygen-containing gas should be stopped while unsaturated. However, in this embodiment, since the silicon-containing layer formed on the SiCN layer in Step 4 functions as an oxidation blocking layer configured to prevent oxidation of the SiCN layer, in oxidation of the silicon-containing layer by the oxygen-containing gas in Step 5, there is no need to use an unsaturated region, and use of a saturated region becomes possible. That is, saturation of the oxidation reaction of the silicon-containing layer becomes possible while suppressing separation of C or N from the SiCN layer. Here, while at least a portion of the SiCN layer, which is an under layer of the silicon-containing layer, may be oxidized, even in this case, oxidation of the SiCN layer is suppressed by an oxidation blocking effect of the silicon-containing layer so that the oxidation reaction of the SiCN layer is easily unsaturated and separation of C or N from the SiCN layer can be suppressed. That is, according to the embodiment, while suppressing separation of C or N from the SiCN layer, an oxidation force of the silicon-containing layer can be increased by the oxygen-containing gas in Step 5, and more uniform oxidation processing becomes possible. As a result, improvement in a film-forming rate of the SiOCN film and improvement in film thickness uniformity in the wafer surface become possible.

Further, according to the embodiment, in either of the first sequence and the second sequence, the SiOCN film having good film thickness uniformity in the wafer surface can be formed. In addition, when the SiOCN film formed through the first sequence or the second sequence of the embodiment is used as an insulating film, uniform performance in a surface of the SiOCN film can be provided, and contribution to improvement in performance and yield of the semiconductor device becomes possible.

Furthermore, according to the embodiment, as the processing conditions such as a pressure or gas supply time in the processing chamber in each step of each sequence are controlled, a ratio of the respective elements, i.e., a silicon element, an oxygen element, a carbon element, and a nitrogen element in the SiOCN film, i.e., a silicon concentration, an oxygen concentration, a carbon concentration, and a nitrogen concentration, can be adjusted to control a composition ratio of the SiOCN film.

In addition, in the conventional CVD method, a plurality of kinds of gases including a plurality of elements constituting a thin film to be formed are simultaneously supplied. In this case, in order to control a composition ratio of the thin film, for example, control of a gas supply flow rate upon gas supply can be considered. Further, in this case, even when supply conditions such as a substrate temperature, a pressure in the processing chamber, and a gas supply time upon gas supply are controlled, the composition ratio of the thin film cannot be controlled.

Furthermore, in the ALD method, a plurality of kinds of gases including a plurality of elements constituting a thin film to be formed are alternately supplied. In this case, in order to control a composition ratio of the thin film to be formed, for example, control of a gas supply flow rate and a gas supply time upon supply of each gas may be considered. In addition, in the case of the ALD method, since supply of the source gas is provided for the purpose of adsorption saturation of the source gas onto the substrate surface, there is no need to control the pressure in the processing chamber. That is, the adsorption saturation of the source gas is realized at any pressure value as long as the adsorption saturation of the source gas occurs at a predetermined pressure or less in which the source gas is adsorbed with respect to the reaction temperature and the pressure in the processing chamber is a predetermined pressure or less. For this reason, conventionally, when a film is formed through the ALD method, the pressure in the processing chamber is set to a pressure according to exhaust capability of the substrate processing apparatus with respect to the gas supply amount. When the pressure in the processing chamber is varied, since chemisorption of the source gas onto the substrate surface may be inhibited or may approach the CVD reaction, film forming by the ALD method cannot be appropriately performed. In addition, in order to form a thin film having a predetermined film thickness through the ALD method, since the ALD reaction (adsorption saturation and surface reaction) is repeatedly performed, deposition may be insufficient when each ALD reaction is insufficiently performed until each ALD reaction is saturated, and a sufficient deposition velocity may not be obtained. Accordingly, in the case of the ALD method, it may be difficult to control the composition ratio of the thin film through control of the pressure in the processing chamber.

In the embodiment, in any sequence, as the pressure in the processing chamber or the gas supply time in each step are controlled, the thin film composition ratio is controlled. In addition, preferably, as the pressure in the processing chamber or the pressure and gas supply time is controlled, the thin film composition ratio may be controlled.

When the composition ratio of the thin film is controlled as the pressure in the processing chamber in each step is controlled, influence of an error between different substrate processing apparatuses can be reduced. That is, the composition ratio of the thin film can be similarly controlled between different substrate processing apparatuses through similar control. In this case, when the gas supply time in each step is also controlled, the composition ratio of the thin film can be precisely adjusted, and thus, controllability of control of the composition ratio of the thin film can be improved. In addition, as the pressure in the processing chamber in each step is controlled, improvement in the film-forming rate and control of the composition ratio of the thin film become possible. That is, as the pressure in the processing chamber is controlled, for example, improvement in a growth rate of the silicon-containing layer formed in Step 1 of each sequence and control of the composition ratio of the thin film become possible. As described above, according to the embodiment, the composition ratio of the thin film between different substrate processing apparatuses can be similarly controlled through similar control, controllability of control of the composition ratio of the thin film can be improved, and the film-forming rate, i.e., productivity, can be improved.

In addition, for example, in film-forming by the ALD method, as the gas supply flow rate or the gas supply time in each step is controlled, when the composition ratio of the thin film is controlled, influence of an error between different substrate processing apparatuses is increased. That is, even when similar control is performed between different substrate processing apparatuses, similarly, the composition ratio of the thin film cannot be controlled. For example, even when the gas supply flow rate and the gas supply time are set to the same flow rate and time between different substrate processing apparatuses, due to the error between the apparatuses, the pressure in the processing chamber does not have the same pressure value. Accordingly, in this case, as the pressure in the processing chamber is varied at each substrate processing apparatus, a desired composition ratio control cannot be similarly performed between different substrate processing apparatus. In addition, due to variation in the pressure in the processing chamber at each substrate processing apparatuses, since chemisorption of the source gas onto the substrate surface may be inhibited or may approach the CVD reaction, film-forming by the ALD method may not be appropriately performed.

Further, according to the embodiment, since the silicon oxycarbonitride film having a predetermined composition can be formed, control of etching resistance, permittivity and insulating resistance becomes possible, and formation of a silicon insulating film having a lower permittivity, a better etching resistance and a better insulating resistance than a silicon nitride film (a SiN film) becomes possible.

Furthermore, in Steps 2, 3 and 5 of the first sequence and the second sequence of the embodiment, $C_3H_6$ gas, $NH_3$ gas and $O_2$ gas supplied into the processing chamber 201 are activated with heat to be supplied into the wafer 200. Accordingly, since the reaction can be softly generated, formation, nitridation processing and oxidation processing of the carbon-containing layer can be easily performed with controllability.

In addition, as the silicon insulating film formed by the method of the embodiment is used as a sidewall spacer, a device forming technique having a small leakage current and good workability can be provided.

Further, as the silicon insulating film formed by the method of the embodiment is used as an etch stopper, a device forming technique having good workability can be provided.

Furthermore, according to the embodiment, a silicon insulating film having an ideal stoichiometric proportion can be formed without use of plasma. In addition, since the silicon insulating film can be formed without use of plasma, for example, an application to a process, in which plasma damage may occur, for example, an SADP film of DPT, becomes possible.

Another Embodiment of the Invention

While the embodiment of the present invention has been described in detail above, the present invention is not limited to the above-mentioned embodiment but may be variously modified without departing from the spirit of the present invention.

For example, $O_2$ gas may be directly supplied into the processing chamber 201 through the fourth nozzle 249d, rather than installing the buffer chamber 237 in the processing chamber 201. In this case, the gas supply hole 250d of the fourth nozzle 249d may be directed toward the center of the reaction tube 203 to directly supply the $O_2$ gas toward the wafer 200 through the fourth nozzle 249d. In addition, only the buffer chamber 237 may be installed without installation of the fourth nozzle 249d.

Further, for example, $C_3H_6$ gas, $NH_3$ gas and $O_2$ gas supplied into the processing chamber 201 may be activated using, for example, plasma, not limited to activation with heat. In this case, for example, each gas may be plasma-excited using a plasma source, which is a plasma generator.

Furthermore, for example, in Step 5 of the first sequence and the second sequence, a hydrogen-containing gas may be supplied with an oxygen-containing gas. As the oxygen-containing gas and the hydrogen-containing gas are supplied into the processing vessel under a pressure under a heated atmospheric pressure (decompression) atmosphere, the oxygen-containing gas and the hydrogen-containing gas may be reacted with each other in the processing vessel to generate an oxidizing species including oxygen such as atomic oxygen (0), and oxidation may be performed by the oxidizing species. In this case, an oxidizing force, i.e., an oxidizing rate, can be improved in comparison with the case in which oxidation is performed by the oxygen-containing gas only, and an oxidation time can be reduced. The oxidation processing is performed under a non-plasma decompression atmosphere. As the hydrogen-containing gas, for example, hydrogen ($H_2$) gas, ammonia ($NH_3$) gas, methane ($CH_4$) gas, and so on may be used. In this case, the hydrogen-containing gas is supplied through the hydrogen-containing gas supply system.

In addition, in the above-mentioned embodiment, while an example in which, after the SiCN layer is deposited on the wafer to one layer or more, the SiO layer is deposited to one layer or more, and these are alternately repeated to form the SiOCN film through stacking has been described, a sequence of the stacking may be reversed. That is, after the SiO layer is deposited on the wafer to one layer or more, the SiCN layer may be deposited to one layer or more, and these may be alternately repeated to form the SiOCN film through the stacking.

Further, in the above-mentioned embodiment, while an example in which, after the SiCN layer is deposited to one layer or more, the SiO layer is deposited to one layer or more, and these are alternately repeated to form the SiOCN film through the stacking has been described, the SiOCN film may be formed through the stacking of a layer different from these layers.

For example, after the SiOC layer is deposited to one layer or more, the SiN layer may be deposited to one layer or more, and these may be alternately repeated to form the SiOCN film through the stacking. In this case, a process of supplying a silicon-containing gas, a carbon-containing gas, and an oxygen-containing gas into the processing vessel, in which the wafer is accommodated, to form a SiOC layer having a predetermined thickness, and a process of supplying a silicon-containing gas and a nitrogen-containing gas into the processing vessel to form a SiN layer having a predetermined thickness are alternately repeated to form a SiOCN film having a predetermined film thickness and formed by alternately stacking the SiOC layer and the SiN layer on the wafer. Even in this case, a sequence of the stacking may be reversed. That is, after the SiN layer is deposited to one layer or more, the SiOC layer may be deposited to one layer or more, and these may be alternately repeated to form the SiOCN film through the stacking.

In addition, for example, after the SiON layer is deposited to one layer or more, the SiC layer may be deposited to one layer or more, and these may be alternately repeated to form the SiOCN film through the stacking. In this case, a process of supplying a silicon-containing gas, a nitrogen-containing gas and an oxygen-containing gas into the processing vessel, in which the wafer is accommodated, to form a SiON layer having a predetermined thickness, and a process of supplying a silicon-containing gas and a carbon-containing gas into the processing vessel to form a SiC layer having a predetermined thickness are alternately repeated to form a SiOCN film having a predetermined film thickness and formed by alternately stacking the SiON layer and the SiC layer on the wafer. In this case, a sequence of the stacking may be reversed. That is, after the SiC layer is deposited to one layer or more, the SiON layer may be deposited to one layer or more, and these may be alternately repeated to form the SiOCN film through the stacking.

That is, after a layer of one layer or more including Si and at least one of O, C and N is deposited, a layer of one layer or more including Si and other elements, other than the at least one of O, C and N, may be deposited, and these may be alternately repeated to form a SiOCN film through the stacking. However, in comparison with the case in which the SiOC layer and the SiN layer are alternately stacked to form the SiOCN film or the case in which the SiON layer and the SiC layer are alternately stacked to form the SiOCN, like the embodiment, the SiOCN film may be formed with better controllability in the case in which the SiCN layer and the SiO layer are alternately stacked on the wafer to form the SiOCN film.

In addition, in the embodiment, while an example in which the SiCN layer is deposited to one layer or more, the SiO layer is deposited to one layer or more, and these are alternately repeated to form the SiOCN film through the stacking has been described, instead of the SiO layer, a boron nitride layer (a BN layer) may be deposited, and instead of the SiOCN film, a silicon boron carbonitride film (a SiBCN film) may be formed. That is, the film forming technique of the SiOCN film (a laminate method) in the above-mentioned embodiment may be applied to the film-forming of the SiBCN film. In this case, after the SiCN layer is deposited to one layer or more, the BN layer is deposited to one layer or more, and these are alternately repeated to form the SiBCN through the stacking.

In this case, specifically, a process of supplying a silicon-containing gas, a carbon-containing gas, and a nitrogen-containing gas to the heated wafer 200 in the processing vessel to form a silicon carbonitride layer (a SiCN layer) having a predetermined thickness; and a process of supplying a boron-containing gas and a nitrogen-containing gas to the heated wafer 200 in the processing vessel to form a boron nitride layer (a BN layer) having a predetermined thickness are alternately repeated to form a silicon boron carbonitride film (a SiBCN film) having a predetermined thickness and formed by alternately stacking the silicon carbonitride layer and the boron nitride layer on the wafer 200.

Figure 7:
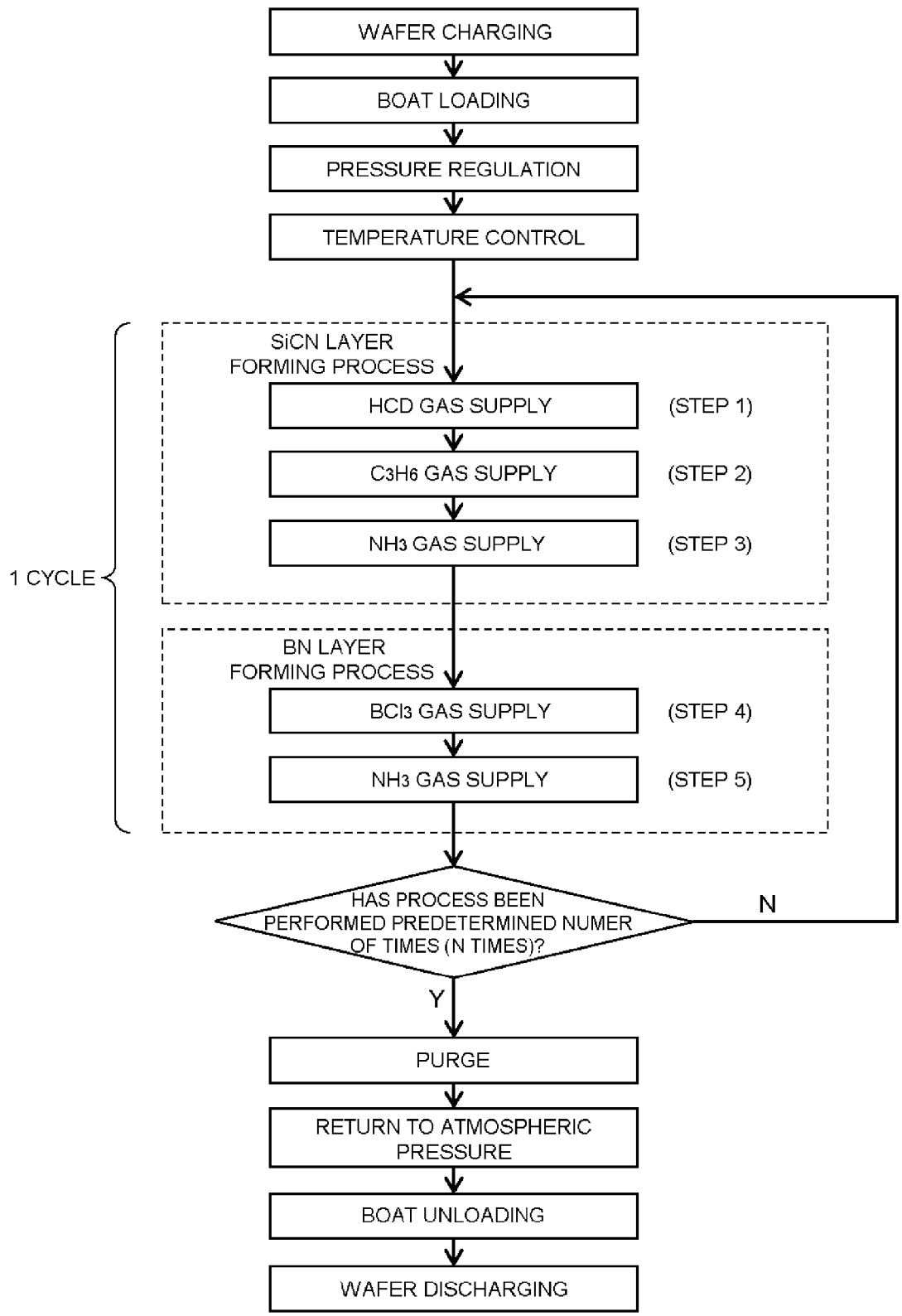
FIG. 7 is a view showing a film-forming flow in an applied example in the first sequence of the embodiment.
Figure 8:
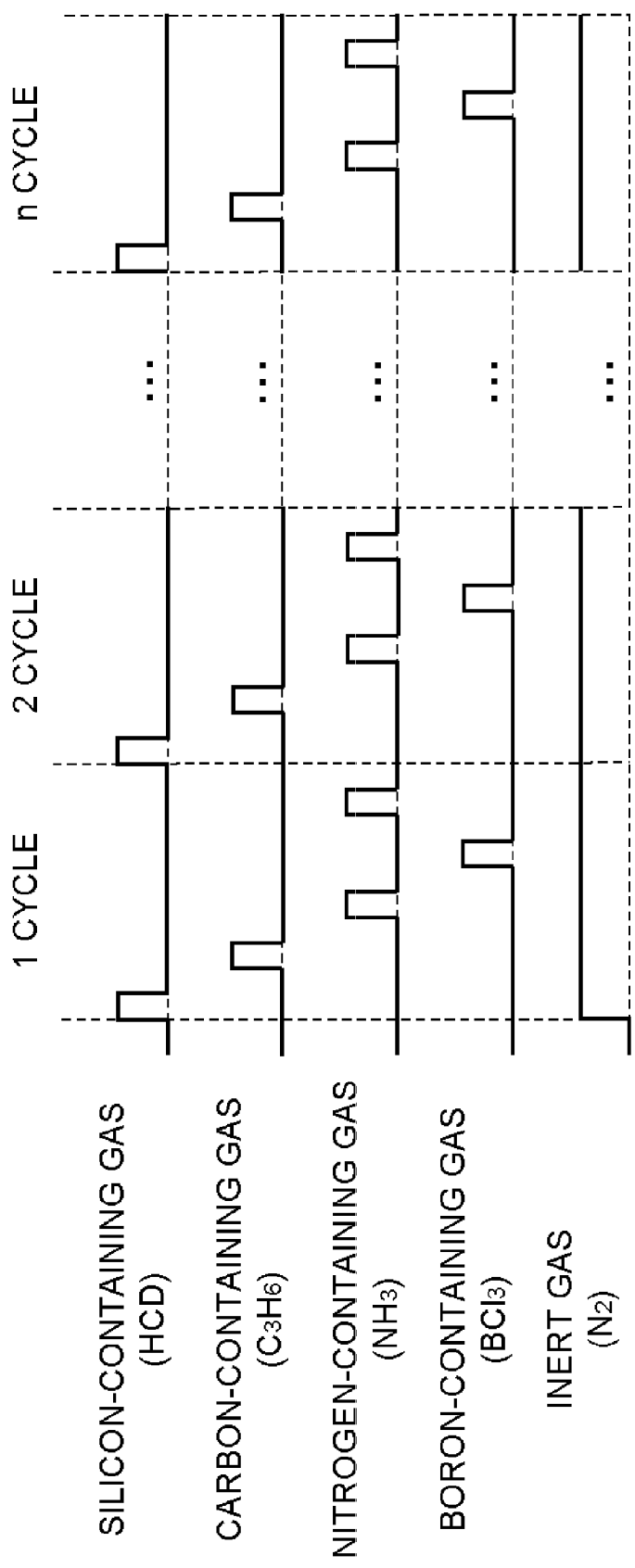
FIG. 8 is a view showing gas supply timing in the applied example in the first sequence of the embodiment.

FIGS. 7 and 8 show a film-forming flow and gas supply timing of an example of a sequence (hereinafter referred to as a first sequence of an applied example) in which the film-forming according to the first sequence of the above-mentioned embodiment is applied to film-forming of the SiBCN film, respectively.

In the first sequence of the applied example, a process (Step 1) of supplying a silicon-containing gas to the heated wafer 200 in the processing vessel to form a silicon-containing layer, a process (Step 2) of supplying a carbon-containing gas to the heated wafer 200 in the processing vessel to form a carbon-containing layer on the silicon-containing layer to form a layer including silicon and carbon, a process (Step 3) of supplying a nitrogen-containing gas to the heated wafer 200 in the processing vessel to nitride the layer including silicon and carbon to form a silicon carbonitride layer (a SiCN layer), a process (Step 4) of supplying a boron-containing gas to the heated wafer 200 in the processing vessel to form a boron-containing layer, and a process (Step 5) of supplying a nitrogen-containing gas to the heated wafer 200 in the processing vessel to nitride the boron-containing layer to form a boron nitride layer (a BN layer) are set as one cycle, and the cycle is performed a predetermined number of times (n times) to form a silicon boron carbonitride film (a SiBCN film) having a predetermined thickness and formed by alternately stacking the silicon carbonitride layer and the boron nitride layer on the wafer 200.

Figure 9:
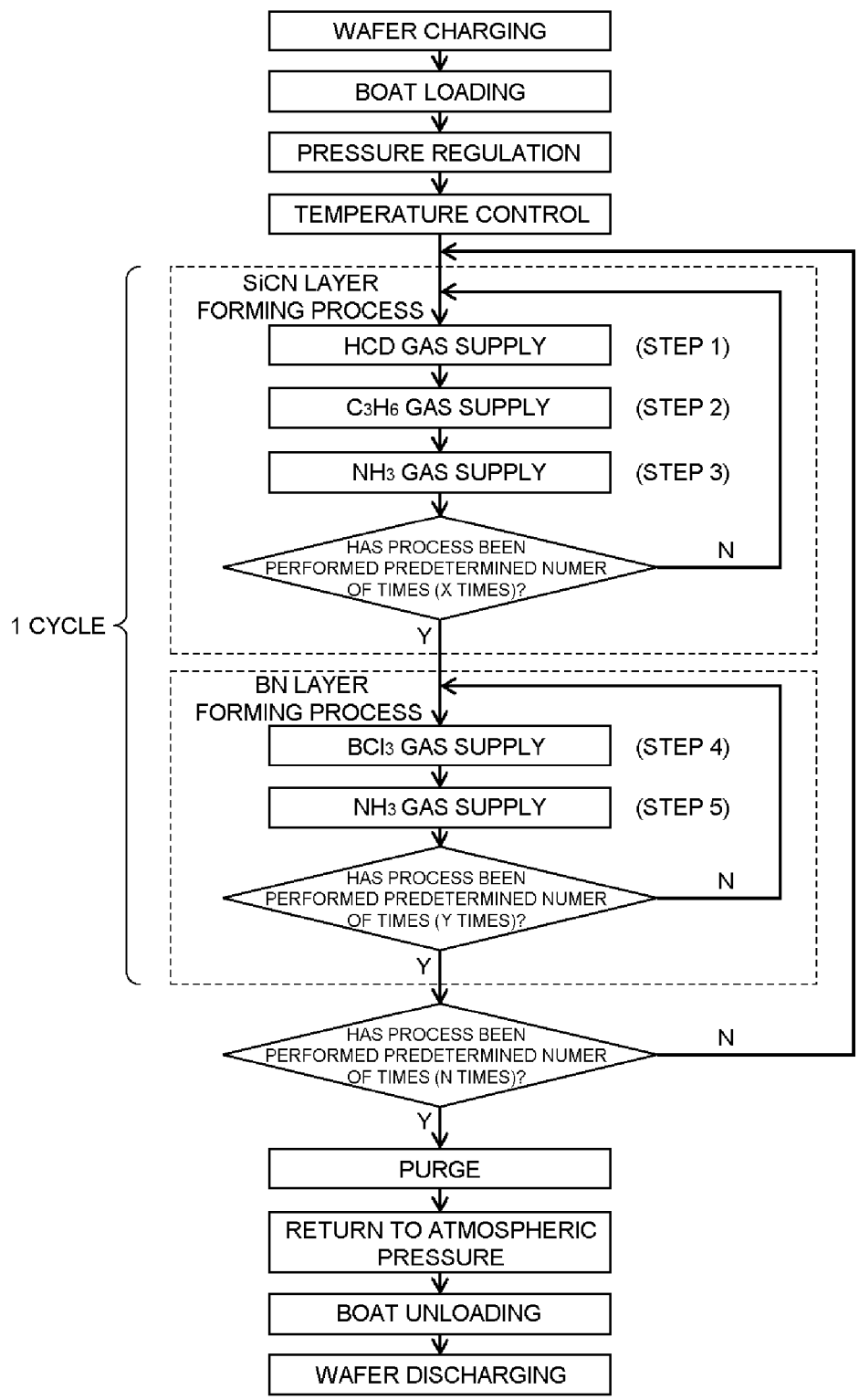
FIG. 9 is a view showing a film-forming flow in an applied example in the second sequence of the embodiment.
Figure 10:
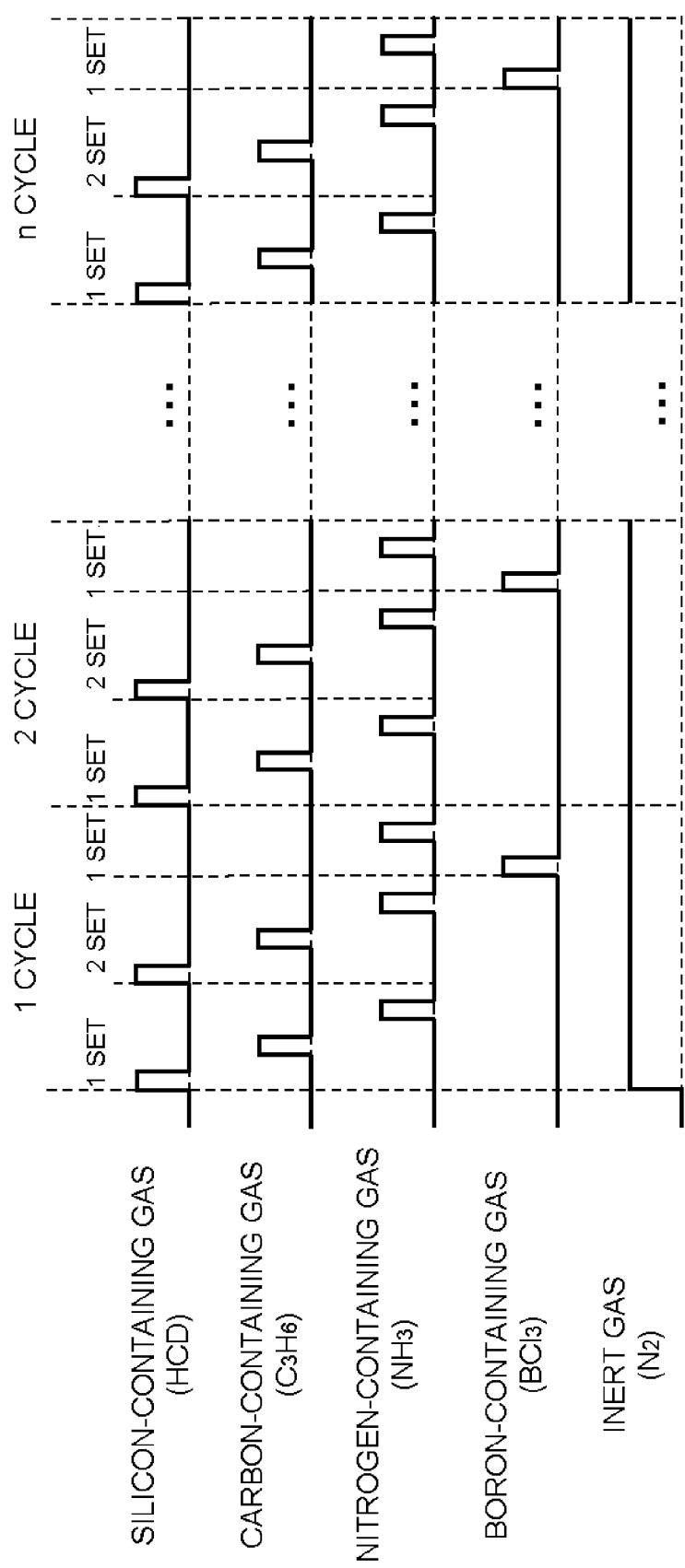
FIG. 10 is a view showing gas supply timing in the applied example in the second sequence of the embodiment.

In addition, FIGS. 9 and 10 show a film-forming flow and gas supply timing of an example of a sequence (hereinafter referred to as a second sequence of the applied example) in which the film-forming according to the second sequence of the above-mentioned embodiment is applied to film-forming of the SiBCN film, respectively.

In the second sequence of the applied example, a process in which a process (Step 1) of supplying a silicon-containing gas to the heated wafer 200 in the processing vessel to form a silicon-containing layer, a process (Step 2) of supplying a carbon-containing gas to the heated wafer 200 in the processing vessel to form a carbon-containing layer on the silicon-containing layer to form a layer including silicon and carbon, and a process (Step 3) of supplying a nitrogen-containing gas to the heated wafer 200 in the processing vessel to nitride the layer including silicon and carbon to form a silicon carbonitride layer are set as a first set, and the first set is performed a predetermined number of times (x times) to form a silicon carbonitride layer (a SiCN layer) having a predetermined thickness; and a process in which a process (Step 4) of supplying a boron-containing gas to the heated wafer 200 in the processing vessel to form a boron-containing layer, and a process (Step 5) of supplying a nitrogen-containing gas to the heated wafer 200 in the processing vessel to nitride the boron-containing layer to form a boron nitride layer are set as a second set, and the second set is performed a predetermined number of times (y times) to form a boron nitride layer (a BN layer) having a predetermined thickness; are set as one cycle, and the cycle is performed a predetermined number of times (n times) to form a silicon boron carbonitride film (a SiBCN film) having a predetermined film thickness and formed by alternately stacking the silicon carbonitride layer and the boron nitride layer on the wafer 200.

In either of the first sequence and the second sequence of the applied example, the above-mentioned cycle may be repeated a plurality of times. In addition, in either of the first sequence and the second sequence of the applied example, in the process of forming the silicon-containing layer, the silicon-containing gas is supplied to the wafer 200 under a condition in which a CVD reaction occurs, and in the process of forming the boron-containing layer, the boron-containing gas is supplied to the wafer 200 under a condition in which a CVD reaction occurs.

In the first sequence and the second sequence of the applied example, for example, boron trichloride ($BCl_3$) gas or diborane ($B_2H_6$) gas may be used as the boron-containing gas. In FIGS. 7, 8, 9 and 10, an example of using $BCl_3$ gas as the boron-containing gas is shown. The boron-containing gas is supplied through the boron-containing gas supply system. Processing conditions upon supply of the silicon-containing gas, the carbon-containing gas and the nitrogen-containing gas may be substantially the same as the processing conditions upon supply of the silicon-containing gas, the carbon-containing gas and the nitrogen-containing gas in the above-mentioned embodiment, and processing conditions upon supply of the boron-containing gas may be substantially the same as the processing conditions upon supply of the carbon-containing gas in the above-mentioned embodiment. In addition, while a chemisorption layer of a boron layer (a B layer) or a boron-containing gas (for example, $BCl_3$ gas), which is a boron-containing layer, i.e., a chemisorption layer of a material ($BCl_x$) decomposed from the $BCl_3$ gas, is formed on the SiCN layer by supply of the boron-containing gas, even in this case, an adsorption state thereof may become an unsaturated state.

In addition, in order for the adsorption state of the $BCl_x$ onto the SiCN layer to be unsaturated, while the processing conditions upon supply of the boron-containing gas may be substantially the same as the above-mentioned processing conditions, when the processing conditions upon supply of the boron-containing gas are replaced with the following processing conditions, the adsorption state of the $BCl_x$ onto the SiCN layer can be easily unsaturated.

Wafer temperature: 500 to 630° C.
Pressure in processing chamber: 133 to 2,666 Pa
$BCl_3$ gas partial pressure: 67 to 2,515 Pa
$BCl_3$ gas supply flow rate: 1,000 to 5,000 sccm
$N_2$ gas supply flow rate: 300 to 1,000 sccm
$BCl_3$ gas supply time: 6 to 100 seconds According to the applied embodiment, operational effects similar to the above-mentioned embodiment can be obtained. For example, in the first sequence or the second sequence of the applied embodiment, as the processing conditions such as the pressure or gas supply time in the processing vessel of each step are controlled, a ratio of each element, i.e., a silicon element, a boron element, a carbon element and a nitrogen element in the SiBCN layer, i.e., a silicon concentration, a boron concentration, a carbon concentration and a nitrogen concentration, can be adjusted to control a composition ratio of the SiBCN film.

In addition, for example, in the first sequence or the second sequence of the applied example, as a thickness of either of the SiCN layer and the BN layer is controlled, a composition ratio of the SiBCN film can be controlled. For example, when the SiCN layer having a thickness of several atomic layers and the BN layer having a thickness of less than one atomic layer are alternately stacked, a ratio of the silicon element, the nitrogen element and the carbon element with respect to the boron element of the SiBCN film can be controlled to be enriched (a ratio of the boron element becomes poor). In addition, for example, when the SiCN layer having a thickness of less than one atomic layer and the BN layer having a thickness of several atomic layers are alternately stacked, a ratio of the silicon element and the boron element with respect to the nitrogen element and the carbon element of the SiBCN film can be controlled to be enriched (a ratio of the nitrogen element and the carbon element becomes poor). Further, according to the processing conditions, the SiCN layer and the BN layer, which are alternately stacked, can be diffused to each other.

Further, for example, in the second sequence of the applied embodiment, as a layer number of at least one layer of the SiCN layer and the BN layer, i.e., a set number (x, y) is controlled, the composition ratio of the SiBCN film can be precisely controlled. For example, when the SiCN layer of five layers and the BN layer of two layers are alternately stacked, a ratio of the silicon element, the nitrogen element and the carbon element with respect to the boron element of the SiBCN film can be controlled to be enriched (a ratio of the boron element becomes poor). In addition, for example, when the SiCN layer of two layers and the BN layer of five layers are alternately stacked, a ratio of the silicon element and the boron element with respect to the nitrogen element and the carbon element of the SiBCN film can be controlled to be enriched (a ratio of the nitrogen element and the carbon element becomes poor). Further, according to a combination of the set number (x, y), minute composition control in which a ratio of a specific element becomes a small amount (for example, several %) becomes possible. Furthermore, since increase in each set number can increase the layer number of the SiCN layer or the BN layer formed at each one cycle by the set number, improvement in cycle rate and improvement in film-forming rate become possible.

In addition, for example, while an example in which a silicon-based insulating film (a SiOCN film) including a semiconductor element such as silicon, which is an oxycarbonitride film, has been described in the above-mentioned embodiment, the present invention may be applied to the case in which a metal-based thin film including a metal element such as titanium (Ti), zirconium (Zr), hafnium (Hf), tantalum (Ta), aluminum (Al), molybdenum (Mo), tungsten (W), gallium (Ga) and germanium (Ge) is formed.

That is, the present invention may be applied to the case in which a metal oxycarbonitride film such as a titanium oxycarbonitride film (a TiOCN film), a zirconium oxycarbonitride film (a ZrOCN film), a hafnium oxycarbonitride film (a HfOCN film), a tantalum oxycarbonitride film (a TaOCN film), an aluminum oxycarbonitride film (an AlOCN film), a molybdenum oxycarbonitride film (a MoOCN film), a tungsten oxycarbonitride film (a WOCN film), a gallium oxycarbonitride film (a GaOCN film), a germanium oxycarbonitride film (a GeOCN film), a combination thereof, or a mixture thereof is formed.

In this case, instead of the silicon source gas in the above-mentioned embodiment, film-forming may be performed by the sequence of the above-mentioned embodiment (the first sequence and the second sequence) using a metal source gas (a metal element-containing gas) such as a titanium source gas, a zirconium source gas, a hafnium source gas, a tantalum source gas, an aluminum source gas, a molybdenum source gas, a tungsten source gas, a gallium source gas and a geranium source gas.

That is, in this case, for example, in the first sequence, a process (Step 1) of supplying a metal element-containing gas to the heated wafer 200 in the processing vessel to form a metal element-containing layer, a process (Step 2) of supplying a carbon-containing gas to the heated wafer 200 in the processing vessel to form a carbon-containing layer on the metal element-containing layer to form a layer including a metal element and carbon, a process (Step 3) of supplying a nitrogen-containing gas to the heated wafer 200 in the processing vessel to nitride the layer including a metal element and carbon to form a metal carbonitride layer, a process (Step 4) of supplying a metal element-containing gas to the heated wafer 200 in the processing vessel to form a metal element-containing layer, and a process (Step 5) of supplying an oxygen-containing gas to the heated wafer 200 in the processing vessel to oxidize the metal element-containing layer to form a metal oxide layer are set as one cycle, and the cycle is performed a predetermined number of times (n times) to form a metal oxycarbonitride film having a predetermined film thickness and formed by alternately deposing the metal carbonitride layer and the metal oxide layer on the wafer 200.

In addition, in this case, for example, in the second sequence, a process in which a process (Step 1) of supplying a metal element-containing gas to the heated wafer 200 in the processing vessel to form a metal element-containing layer, a process (Step 2) of supplying a carbon-containing gas to the heated wafer 200 in the processing vessel to form a carbon-containing layer on the metal element-containing layer to form a layer including a metal element and carbon, and a process (Step 3) of supplying a nitrogen-containing gas to the heated wafer 200 in the processing vessel to nitride the layer including a metal element and carbon to form a metal carbonitride layer are set as a first set, and the first set is performed a predetermined number of times (x times) to form the metal carbonitride layer having a predetermined thickness; and a process in which a process (Step 4) of supplying a metal element-containing gas to the heated wafer 200 in the processing vessel to form a metal element-containing layer, and a process (Step 5) of supplying an oxygen-containing gas to the heated wafer 200 in the processing vessel to oxidize the metal element-containing layer to form a metal oxide layer are set as a second set, and the second set is performed a predetermined number of times (y times) to form the metal oxide layer having a predetermined thickness; are set as one cycle, and the cycle is performed a predetermined number of times (n times) to form a metal oxycarbonitride film having a predetermined film thickness and formed by alternately stacking the metal carbonitride layer and the metal oxide layer on the wafer 200.

In either of the first sequence and the second sequence, the above-mentioned cycle may be repeated a plurality of times. In addition, in either of the first sequence and the second sequence, in the process of forming the metal element-containing layer, the metal element-containing gas is supplied to the wafer 200 under a condition in which a CVD reaction occurs.

For example, when a TiOCN film is formed as the metal oxycarbonitride film, an organic source such as tetrakisethylmethylaminotitanium (Ti[N($C_2H_5$)($CH_3$)]$_4$, abbreviation: TEMAT), tetrakisdimethlyaminotitanium (Ti[N($CH_3$)$_2$]$_4$, abbreviation: TDMAT), and tetrakisdiethylaminotitanium (Ti[N($C_2H_5$)$_2$]$_4$, abbreviation: TDEAT), or an inorganic source such as titanium tetrachloride ($TiCl_4$) may be used as a source including Ti. The gases of the above-mentioned embodiment may be used as the carbon-containing gas, the nitrogen-containing gas, or the oxygen-containing gas. In addition, while the processing conditions at this time may be the same processing conditions as in the above-mentioned embodiment, more preferably, a wafer temperature may be within a range of, for example, 100 to 500° C., and a pressure in the processing chamber may be within a range of, for example, 1 to 1,000 Pa.

In addition, for example, when a ZrOCN film is formed as the metal oxycarbonitride film, an organic source such as tetrakisethylmethylaminozirconium (Zr[N($C_2H_5$)($CH_3$)]$_4$, abbreviation: TEMAZ), tetrakisdimethylaminozirconium (Zr[N(CH3)$_2$]$_4$, abbreviation: TDMAZ), and tetrakisdiethylaminozirconium (Zr[N($C_2H_5$)$_2$]$_4$, abbreviation: TDEAZ), or an inorganic source such as zirconium tetrachloride ($ZrCl_4$) may be used as a source including Zr. The gases in the above-mentioned embodiment may be used as the carbon-containing gas, the nitrogen-containing gas, or the oxygen-containing gas. In addition, while the processing conditions at this time may be the same processing conditions as in the above-mentioned embodiment, more preferably, a wafer temperature may be within a range of, for example, 100 to 400° C., and a pressure in the processing chamber may be within a range of, for example, 1 to 1,000 Pa.

Further, for example, when a HfOCN film is formed as the metal oxycarbonitride film, an organic source such as tetrakisethylmethylaminohafnium (Hf[N($C_2H_5$)($CH_3$)]$_4$, abbreviation: TEMAH), tetrakisdimethylamonohafnium (Hf[N($CH_3$)$_2$]$_4$, abbreviation: TDMAH), and tetrakisdiethylaminohafnium (Hf[N($C_2H_5$)$_2$]$_4$, abbreviation: TDEAH), or an inorganic source such as hafnium tetrachloride ($HfCl_4$) may be used as a source including Hf. The gases in the above-mentioned embodiment may be used as the carbon-containing gas, the nitrogen-containing gas, or the oxygen-containing gas. In addition, while the processing conditions at this time may be the same processing conditions as in the above-mentioned embodiment, more preferably, a wafer temperature may be within a range of, for example, 100 to 400° C., and a pressure in the processing chamber may be within a range of, for example, 1 to 1,000 Pa.

Furthermore, for example, when a TaOCN film is formed as the metal oxycarbonitride film, an organic source such as pentaethoxytantalum (Ta($O_2CH_5$)$_5$, abbreviation: PET), and trisdiethylaminotertiarybutyliminotantalum (Ta(NC($CH_3$)$_3$)(N($C_2H_5$)$_2$)$_3$, abbreviation: TBTDET), or an inorganic source such as tantalum pentachloride ($TaCl_5$) and tantalum pentafluoride ($TaF_5$) may be used as a source including Ta. The gases in the above-mentioned embodiment may be sued as the carbon-containing gas, the nitrogen-containing gas, or the oxygen-containing gas. In addition, while the processing conditions at this time may be the same processing conditions as in the above-mentioned embodiment, more preferably, a wafer temperature may be within a range of, for example, 100 to 500° C., and a pressure in the processing chamber may be within a range of, 1 to 1,000 Pa.

Further, for example, when an AlOCN film is used as the metal oxycarbonitride film, an organic source such as trimethylaluminum (Al($CH_3$)$_3$, abbreviation: TMA) or an inorganic source such as trichloroaluminum ($AlCl_3$) may be used as a source including Al. The gases in the above-mentioned embodiment may be used as the carbon-containing gas, the nitrogen-containing gas, or the oxygen-containing gas. In addition, while the processing conditions at this time may be the same processing conditions as in the above-mentioned embodiment, more preferably, a wafer temperature may be within a range of, for example, 100 to 400° C., and a pressure in the processing chamber may be within a range of, 1 to 1,000 Pa.

As described above, the present invention may be applied to the film-forming of the metal oxycarbonitride film, and even in this case, operational effects similar to the above-mentioned embodiment may be provided. That is, the present invention may be applied to the case in which an oxycarbonitride film including a predetermined element such as a semiconductor element or a metal element is formed.

In addition, while an example in which the film-forming is performed using a batch-type substrate processing apparatus configured to process a plurality of substrates at a time has been described in the above-mentioned embodiment, the present invention is not limited thereto but may be applied to the case in which the film-forming is performed using a sheet-feeding type substrate processing apparatus configured to process one or a plurality of substrates at a time.

Further, each of the above-mentioned embodiment, variant and applied example may be appropriately combined and used.

Furthermore, the present invention may be realized even when, for example, the process recipe of the conventional substrate processing apparatus is varied. When the process recipe is varied, the process recipe in accordance with the present invention may be installed in the conventional substrate processing apparatus via an electric communication line or a recording medium in which the process recipe is recorded, or an input/output device of the conventional substrate processing apparatus may be operated to change the process recipe itself into the process recipe in accordance with the present invention.

EXAMPLE

First Example

A SiOCN film was formed while controlling a composition ratio by the first sequence according to the embodiment, and a composition ratio of the SiOCN film and film thickness uniformity in a wafer surface were measured. HCD gas, which is a silicon-containing gas, $C_3H_6$ gas, which is a carbon-containing gas, $NH_3$ gas, which is a nitrogen-containing gas, and $O_2$ gas, which is an oxygen-containing gas, were used. Control of the composition ratio of the SiOCN film was performed by adjusting a pressure and gas supply time (irradiation time), which are parameters for controlling the composition ratio.

First, the pressure in the processing chamber in a second step of the first sequence and $C_3H_6$ gas supply time of the second step were adjusted, and the SiOCN film having a carbon concentration of about 8 atoms % was formed on a wafer. The processing conditions at this time were set as the following conditions.

<First Sequence (Standard Processing Conditions)>
(First Step)
Temperature in processing chamber: 630° C.
Pressure in processing chamber: 133 Pa (1 Torr)
HCD gas supply flow rate: 0.2 slm
HCD gas irradiation time: 6 seconds
(Second Step)
Temperature in processing chamber: 630° C.
Pressure in processing chamber: 399 Pa (3 Torr)
$C_3H_6$ gas supply flow rate: 1 slm
$C_3H_6$ gas irradiation time: 12 seconds
(Third Step)
Temperature in processing chamber: 630° C.
Pressure in processing chamber: 866 Pa (6.5 Torr)
$NH_3$ gas supply flow rate: 4.5 slm
$NH_3$ gas irradiation time: 18 seconds
(Fourth Step)
Temperature in processing chamber: 630° C.
Pressure in processing chamber: 133 Pa (1 Torr)
HCD gas supply flow rate: 0.2 slm
HCD gas irradiation time: 6 seconds
(Fifth Step)
Temperature in processing chamber: 630° C.
Pressure in processing chamber: 133 Pa (1 Torr)
$O_2$ gas supply flow rate: 1 slm
$O_2$ gas irradiation time: 18 seconds As the processing conditions were set as standard processing conditions and the processing conditions were adjusted, formation of the SiOCN film having a carbon concentration of about 12 atoms % was tested.

As a result, as the pressure in the processing chamber in the second step was set from 399 Pa (3 Torr) to 2394 Pa (18 Torr), the SiOCN film having a carbon concentration of about 12 atoms % was obtained and the SiOCN film having a carbon ratio higher than that of the SiOCN film formed by the standard processing conditions could be obtained. That is, as the pressure in the processing chamber in the second step was set to be higher than the pressure in the processing chamber in the standard processing conditions, the SiOCN film having a high carbon ratio could be formed. In addition, the nitrogen concentration was reduced by an increase in carbon concentration. In addition, processing conditions other than the pressure in the processing chamber in the second step were set the same as the standard processing conditions. That is, the processing conditions at this time were set as the following conditions.

<First Sequence (Pressure Change Upon Supply of $C_3H_6$ Gas)>
(First Step)
Temperature in processing chamber: 630° C.
Pressure in processing chamber: 133 Pa (1 Torr)
HCD gas supply flow rate: 0.2 slm
HCD gas irradiation time: 6 seconds
(Second Step)
Temperature in processing chamber: 630° C.
Pressure in processing chamber: 2,394 Pa (18 Torr)
$C_3H_6$ gas supply flow rate: 1 slm
$C_3H_6$ gas irradiation time: 12 seconds
(Third Step)
Temperature in processing chamber: 630° C.
Pressure in processing chamber: 866 Pa (6.5 Torr)
$NH_3$ gas supply flow rate: 4.5 slm
$NH_3$ gas irradiation time: 18 seconds
(Fourth Step)
Temperature in processing chamber: 630° C.
Pressure in processing chamber: 133 Pa (1 Torr)
HCD gas supply flow rate: 0.2 slm
HCD gas irradiation time: 6 seconds
(Fifth Step)
Temperature in processing chamber: 630° C.
Pressure in processing chamber: 133 Pa (1 Torr)
$O_2$ gas supply flow rate: 1 slm
$O_2$ gas irradiation time: 18 seconds In addition, as a $C_3H_6$ gas irradiation time in the second step was set from 12 seconds to 72 seconds, the SiOCN film having a carbon concentration of about 12 atoms % was obtained, and a SiOCN film having a carbon ratio higher than that of the SiOCN film formed by the standard processing conditions could be formed. That is, the $C_3H_6$ gas irradiation time in the second step was set to be larger than the $C_3H_6$ gas irradiation time in the standard processing conditions, and the SiOCN film having a high carbon ratio could be formed. In addition, the nitrogen concentration was reduced by an increase in carbon concentration. Further, the processing conditions other than the $C_3H_6$ gas irradiation time in the second step were set the same as the standard processing conditions. That is, the processing conditions at this time were set as the following conditions.

<First Sequence ($C_3H_6$ Gas Irradiation Time Change)>
(First Step)
Temperature in processing chamber: 630° C.
Pressure in processing chamber: 133 Pa (1 Torr)
HCD gas supply flow rate: 0.2 slm
HCD gas irradiation time: 6 seconds
(Second Step)
Temperature in processing chamber: 630° C.
Pressure in processing chamber: 399 Pa (3 Torr)
$C_3H_6$ gas supply flow rate: 1 slm
$C_3H_6$ gas irradiation time: 72 seconds
(Third Step)
Temperature in processing chamber: 630° C.
Pressure in processing chamber: 866 Pa (6.5 Torr)
$NH_3$ gas supply flow rate: 4.5 slm
$NH_3$ gas irradiation time: 18 seconds
(Fourth Step)
Temperature in processing chamber: 630° C.
Pressure in processing chamber: 133 Pa (1 Torr)
HCD gas supply flow rate: 0.2 slm
HCD gas irradiation time: 6 seconds
(Fifth Step)
Temperature in processing chamber: 630° C.
Pressure in processing chamber: 133 Pa (1 Torr)
$O_2$ gas supply flow rate: 1 slm
$O_2$ gas irradiation time: 18 seconds At this time, since the film thickness uniformity in the wafer surface of each formed SiOCN film was within a range of ±1.5%, good results were obtained. In addition, it will be appreciated that the film thickness uniformity in the wafer surface shows a degree of deviation in film thickness distribution in the wafer surface, and as the degree is reduced, film thickness distribution uniformity in the wafer surface is improved.

As described above, according to the example, it will be appreciated that the SiOCN film having good film thickness uniformity in the wafer surface can be formed. In addition, it will be appreciated that, when the SiOCN film according to the example is used as an insulating film, uniform performance in the surface of the SiOCN film can be provided, and can contribute to improvement in performance of the semiconductor device or improvement in yield.

Second Example

A SiOCN film was formed while controlling a composition ratio by the second sequence of the above-mentioned embodiment, and the composition ratio of the SiOCN film and film thickness uniformity in the wafer surface were measured. HCD gas, which is a silicon-containing gas, $C_3H_6$ gas, which is a carbon-containing gas, $NH_3$ gas, which is a nitrogen-containing gas, and $O_2$ gas, which is an oxygen-containing gas, were used. The processing conditions in each step were set to the same processing conditions as each step of the standard processing conditions of the first example. Control of the composition ratio of the SiOCN film was performed by adjusting each set number in the second sequence, i.e., a set number (x) of a SiCN layer forming process and a set number (y) of a SiO layer forming process.

As a result, when the set number (x) of the SiCN layer forming process in the second sequence was set to 2 and the set number (y) of the SiO layer forming process was set to 1 (x=2, y=1), the SiOCN film having a carbon concentration of about 16 atoms was obtained and the SiOCN film having a carbon ratio higher than that of the SiOCN film formed by the first example, i.e., the first sequence (standard processing conditions) could be formed. In addition, the case (x=1, y=1) in which the set number (x) of the SiCN layer forming process is set to 1 and the set number (y) of the SiO layer forming process was set to 1 corresponds to the first sequence. That is, as the set number (x) of the SiCN layer forming process in the second sequence was set to be larger than a performance number (one time) per cycle of the SiCN layer forming process in the first sequence, the SiOCN film having a high carbon ratio could be formed. In addition, the nitrogen concentration was reduced by an increase in carbon concentration. Here, film thickness uniformity in the wafer surface of the SiOCN film was within a range of ±1.5% and a good result was obtained.

As described above, according to the example, the SiOCN film having good film thickness uniformity in the wafer surface could be obtained. In addition, when the SiOCN film according to the example was used as an insulating film, uniform performance in the surface of the SiOCN film could be provided, and could contribute to improvement in performance of the semiconductor device or improvement in yield.

<Exemplary Embodiment of the Invention>

Hereinafter, exemplary embodiments of the present invention will be additionally stated.

(Supplementary Note 1)

According to one aspect of the present invention, there is provided a method of manufacturing a semiconductor device, including: (a) supplying a gas containing an element, a carbon-containing gas and a nitrogen-containing gas to a heated substrate in a processing vessel to form a carbonitride layer including the element; (b) supplying the gas containing the element and an oxygen-containing gas to the heated substrate in the processing vessel to form an oxide layer including the element; and (c) alternately repeating the steps (a) and (b) to form on the substrate an oxycarbonitride film having the carbonitride layer and the oxide layer alternately stacked therein.

(Supplementary Note 2)

The method of manufacturing the semiconductor device according to Supplementary Note 1, wherein step (a) includes performing a first set of processes including supplying the gas containing the element to the substrate, supplying the carbon-containing gas to the substrate and supplying the nitrogen-containing gas to the substrate a predetermined number of times, and step (b) includes performing a second set of processes including supplying the gas containing the element to the substrate and supplying the oxygen-containing gas to the substrate a predetermined number of times.

(Supplementary Note 3)

The method of manufacturing the semiconductor device according to Supplementary Note 1, wherein step (a) includes performing a first set of processes including supplying the gas containing the element to the substrate to form a first element-containing layer including the element, supplying the carbon-containing gas to the substrate to form a carbon-containing layer on the first element-containing layer to form a layer including the element and carbon, and supplying the nitrogen-containing gas to the substrate to nitride the layer including the element and carbon a predetermined number of times to form the carbonitride layer including the element, and step (b) includes performing a second set of processes including supplying the gas containing the element to the substrate to form a second element-containing layer including the element, and supplying the oxygen-containing gas to the substrate to oxidize the second element-containing layer a predetermined number of times to form the oxide layer including the element.

(Supplementary Note 4)

The method of manufacturing the semiconductor device according to Supplementary Note 3, wherein each of the first element-containing layer and the second element-containing layer includes at least one layer of a continuous deposition layer of the element, a discontinuous deposition layer of the element, a continuous chemisorption layer of the gas containing the element, and a discontinuous chemisorption layer of the gas containing the element.

(Supplementary Note 5)

The method of manufacturing the semiconductor device according to Supplementary Note 3, wherein each of the first element-containing layer and the second element-containing layer includes at least one layer of a continuous deposition layer of the element and a discontinuous deposition layer of the element.

(Supplementary Note 6)

The method of manufacturing the semiconductor device according to any one of Supplementary Notes 3 to 5, wherein the carbon-containing layer includes a discontinuous chemisorption layer of the carbon-containing gas.

(Supplementary Note 7)

The method of manufacturing the semiconductor device according to any one of Supplementary Notes 3 to 6, wherein step (a) includes thermally nitriding the layer including the element and carbon under a condition where a nitridation reaction by the nitrogen-containing gas in the layer including the element and carbon is unsaturated.

(Supplementary Note 8)

The method of manufacturing the semiconductor device according to any one of Supplementary Notes 3 to 6, wherein step (b) includes thermally oxidizing the second element-containing layer under a condition where an oxidation reaction by the oxygen-containing gas in the second element-containing layer is unsaturated.

(Supplementary Note 9)

The method of manufacturing the semiconductor device according to any one of Supplementary Notes 3 to 8, wherein each of forming the first element-containing layer and forming the second element-containing layer includes supplying the gas containing the element to the substrate under a condition where a CVD reaction occurs.

(Supplementary Note 10)

The method of manufacturing the semiconductor device according to any one of Supplementary Notes 1 to 9, wherein the element includes a semiconductor element or a metal element.

(Supplementary Note 11)

The method of manufacturing the semiconductor device according to any one of Supplementary Notes 1 to 10, wherein the element includes silicon.

(Supplementary Note 12)

According to another aspect of the present invention, there is provided a method of manufacturing a semiconductor device, including: (a) performing a first set of processes including supplying a gas containing an element, supplying a carbon-containing gas, and supplying a nitrogen-containing gas to a heated substrate in a processing vessel a predetermined number of times to form a carbonitride including the element; (b) performing a second set of processes including supplying the gas containing the element to the heated substrate in the processing vessel and supplying an oxygen-containing gas to the heated substrate in the processing vessel a predetermined number of times to form an oxide layer including the element; and (c) alternately repeating steps (a) and (b) to form on the substrate an oxycarbonitride film having the carbonitride layer and the oxide layer alternately stacked therein.

(Supplementary Note 13)

According to still another aspect of the present invention, there is provided a method of manufacturing a semiconductor device, including: (a) performing a process of supplying a gas containing an element, a process of supplying a carbon-containing gas, and a process of supplying a nitrogen-containing gas to a heated substrate in a processing vessel to form a carbonitride layer including the element; (b) performing a process of supplying the gas containing the element and a process of supplying an oxygen-containing gas to the heated substrate in the processing vessel to form an oxide layer including the element; and (c) alternately repeating steps (a) and (b) to form on the substrate an oxycarbonitride film having the carbonitride layer and the oxide layer alternately stacked therein.

(Supplementary Note 14)

According to yet another aspect of the present invention, there is provided a method of manufacturing a semiconductor device, including: (a) performing a first set of processes including supplying a gas containing an element to a heated substrate in a processing vessel to form a first element-containing layer including the element, supplying a carbon-containing gas to the heated substrate in the processing vessel to form a carbon-containing layer on the first element-containing layer to form a layer including the element and carbon, and supplying a nitrogen-containing gas to the heated substrate in the processing vessel to nitride the layer including the element and carbon to form a carbonitride layer including the element a predetermined number of times to form a carbonitride layer including the element; (b) performing a second set of processes including supplying the gas containing the element to the heated substrate in the processing vessel to form a second element-containing layer including the element and supplying an oxygen-containing gas to the substrate to oxidize the second element-containing layer to form an oxide layer including the element a predetermined number of times to form an oxide layer including the element; and (c) alternately repeating steps (a) and (b) to form on the substrate an oxycarbonitride film having the carbonitride layer and the oxide layer alternately stacked therein.

(Supplementary Note 15)

According to yet another aspect of the present invention, there is provided a method of manufacturing a semiconductor device, including: (a) performing a process of supplying a gas containing an element to a heated substrate in a processing vessel to form a first element-containing layer including the element, a process of supplying a carbon-containing gas to the heated substrate in the processing vessel to form a carbon-containing layer on the first element-containing layer to form a layer including the element and carbon, and a process of supplying a nitrogen-containing gas to the heated substrate in the processing vessel to nitride the layer including the element and carbon to form a carbonitride layer including the element; and (b) performing a process of supplying the gas containing the element to the heated substrate in the processing vessel to form a second element-containing layer including the element and a process of supplying an oxygen-containing gas to the heated substrate in the processing vessel to oxidize the second element-containing layer to form an oxide layer including the element; and (c) alternately repeating steps (a) and (b) to form on the substrate an oxycarbonitride film having the carbonitride layer and the oxide layer alternately stacked therein.

(Supplementary Note 16)

According to yet another embodiment of the present invention, there is provided a method of processing a substrate, including: (a) performing a process of supplying a gas containing an element, a process of supplying a carbon-containing gas and a process of supplying a nitrogen-containing gas to a heated substrate in a processing vessel to form a carbonitride layer including the element; (b) performing a process of supplying the gas containing the element to the heated substrate in the processing vessel and a process of supplying an oxygen-containing gas to the heated substrate in the processing vessel to form an oxide layer including the element; and (c) alternately repeating steps (a) and (b) to form on the substrate an oxycarbonitride film having the carbonitride layer and the oxide layer alternately stacked therein.

(Supplementary Note 17)

According to yet another aspect of the present invention, there is provided a substrate processing apparatus including: a processing vessel configured to accommodate a substrate; a heater configured to heat the substrate in the processing vessel; an element-containing gas supply system configured to supply a gas containing an element to the substrate in the processing vessel; a carbon-containing gas supply system configured to supply a carbon-containing gas to the substrate in the processing vessel; a nitrogen-containing gas supply system configured to supply a nitrogen-containing gas to the substrate in the processing vessel; an oxygen-containing gas supply system configured to supply an oxygen-containing gas to the substrate in the processing vessel; and a control unit configured to control the heater, the element-containing gas supply system, the carbon-containing gas supply system, the nitrogen-containing gas supply system and the oxygen-containing gas supply system to perform (a) supplying the gas containing the element, the carbon-containing gas and the nitrogen-containing gas to the heated substrate in the processing vessel to form a carbonitride layer including the element, (b) supplying the gas containing the element and the oxygen-containing gas to the heated substrate in the processing vessel to form an oxide layer including the element, and (c) alternately repeating (a) and (b) to form on the substrate an oxycarbonitride film having the carbonitride layer and the oxide layer alternately stacked therein.

(Supplementary Note 18)

According to yet another aspect of the present invention, there is provided a program for causing a computer to execute: sequence (a) of supplying a gas containing an element, a carbon-containing gas and a nitrogen-containing gas to a heated substrate in a processing vessel of a substrate processing apparatus to form a carbonitride layer including the element; sequence (b) of supplying the gas containing the element and an oxygen-containing gas to the heated substrate in the processing vessel to form an oxide layer including the element; and sequence (c) of alternately repeating sequence (a) and sequence (b) to form on the substrate an oxycarbonitride film having the carbonitride layer and the oxide layer alternately stacked therein.

(Supplementary Note 19)

According to yet another aspect of the present invention, there is provided a computer-readable recording medium storing a program for causing a computer to execute: sequence (a) of supplying a gas containing an element, a carbon-containing gas and a nitrogen-containing gas to a heated substrate in a processing vessel of a substrate processing apparatus to form a carbonitride layer including the element; sequence (b) of supplying the gas containing the element and an oxygen-containing gas to the heated substrate in the processing vessel to form an oxide layer including the element; and sequence (c) of alternately repeating sequence (a) and sequence (b) to form on the substrate an oxycarbonitride film having the carbonitride layer and the oxide layer alternately stacked therein.

(Supplementary Note 20)

According to yet another aspect of the present invention, there is provided a method of manufacturing a semiconductor device, including: (a) supplying a gas containing an element, a carbon-containing gas and a nitrogen-containing gas to a heated substrate in a processing vessel to form a carbonitride layer including the element; (b) supplying a boron-containing gas and a nitrogen-containing gas to the heated substrate in the processing vessel to form a boron nitride layer; and (c) alternately repeating steps (a) and (b) to form on the substrate a boron carbonitride film having the carbonitride layer and the boron nitride layer alternately stacked therein.

(Supplementary Note 21)

According to yet another aspect of the present invention, there is provided a method of manufacturing a semiconductor device, including: (a) performing a first set of processes including supplying a gas containing an element, supplying a carbon-containing gas and a process of supplying a nitrogen-containing gas to a heated substrate in a processing vessel a predetermined number of times to form a carbonitride layer including the element; (b) performing a second set of processes including supplying a boron-containing gas to the heated substrate in the processing vessel and supplying a nitrogen-containing gas to the heated substrate in the processing vessel a predetermined number of times to form a boron nitride layer; and (c) alternately repeating steps (a) and (b) to form on the substrate a boron carbonitride film having the carbonitride layer and the boron nitride layer alternately stacked therein.

(Supplementary Note 22)

According to yet another aspect of the present invention, there is provided a method of manufacturing a semiconductor device, including: (a) performing a process of supplying a gas containing an element, a process of supplying a carbon-containing gas and a process of supplying a nitrogen-containing gas to a heated substrate in a processing vessel to form a carbonitride layer including the element; (b) performing a process of supplying a boron-containing gas to the heated substrate in the processing vessel and a process of supplying a nitrogen-containing gas to the heated substrate in the processing vessel to form a boron nitride layer; and (c) alternately repeating steps (a) and (b) to form on the substrate a boron carbonitride film having the carbonitride layer and the boron nitride layer alternately stacked therein.

(Supplementary Note 23)

According to yet another aspect of the present invention, there is provided a method of manufacturing a semiconductor device, including: (a) performing a first set of processes including supplying a gas containing an element to a heated substrate in a processing vessel to form an element-containing layer including the element, supplying a carbon-containing gas to the heated substrate in the processing vessel to form a carbon-containing layer on the element-containing layer to form a layer including the element and carbon, and supplying a nitrogen-containing gas to the heated substrate in the processing vessel to nitride the layer including the element and carbon to form a carbonitride layer including the element a predetermined number of times to form a carbonitride layer including the element; (b) performing a second set of processes including supplying a boron-containing gas to the heated substrate in the processing vessel to form a boron-containing layer and supplying the nitrogen-containing gas to the heated substrate in the processing vessel to nitride the boron-containing layer to form a boron nitride layer a predetermined number of times to form a boron nitride layer; and (c) alternately repeating steps (a) and (b) to form on the substrate a boron carbonitride film having the carbonitride layer and the boron nitride layer alternately stacked therein.

(Supplementary Note 24)

According to yet another aspect of the present invention, there is provided a method of manufacturing a semiconductor device, including: (a) performing a process of supplying a gas containing an element to a heated substrate in a processing vessel to form an element-containing layer including the element, a process of supplying a carbon-containing gas to the heated substrate in the processing vessel to form a carbon-containing layer on the element-containing layer to form a layer including the element and carbon, and a process of supplying a nitrogen-containing gas to the heated substrate in the processing vessel to nitride the layer including the element and carbon to form a carbonitride layer including the element, (b) performing a process of supplying a boron-containing gas to the heated substrate in the processing vessel to form a boron-containing layer and a process of supplying the nitrogen-containing gas to the heated substrate in the processing vessel to nitride the boron-containing layer to form a boron nitride layer; and (c) alternately repeating steps (a) and (b) to form on the substrate a boron carbonitride film having the carbonitride layer and the boron nitride layer alternately stacked therein.

(Supplementary Note 25)

According to yet another aspect of the present invention, there is provided a method of processing a substrate, including: (a) supplying a gas containing an element, a carbon-containing gas and a nitrogen-containing gas to a heated substrate in a processing vessel to form a carbonitride layer including the element; (b) supplying a boron-containing gas and a nitrogen-containing gas to the heated substrate in the processing vessel to form a boron nitride layer; and (c) alternately repeating steps (a) and (b) to form on the substrate a boron carbonitride film having the carbonitride layer and the boron nitride layer alternately stacked therein.

(Supplementary Note 26)

According to yet another aspect of the present invention, there is provided a substrate processing apparatus including: a processing vessel configured to accommodate a substrate; a heater configured to heat the substrate in the processing vessel; an element-containing gas supply system configured to supply a gas containing an element to the substrate in the processing vessel; a carbon-containing gas supply system configured to supply a carbon-containing gas to the substrate in the processing vessel; a nitrogen-containing gas supply system configured to supply a nitrogen-containing gas to the substrate in the processing vessel; a boron-containing gas supply system configured to supply a boron-containing gas to the substrate in the processing vessel; and a control unit configured to control the heater, the element-containing gas supply system, the carbon-containing gas supply system, the nitrogen-containing gas supply system and the boron-containing gas supply system to perform (a) supplying the gas containing the element, the carbon-containing gas and the nitrogen-containing gas to the heated substrate in the processing vessel to form a carbonitride layer including the element, (b) supplying the boron-containing gas and the nitrogen-containing gas to the heated substrate in the processing vessel to form a boron nitride layer, and (c) alternately repeating (a) and (b) to form on the substrate a boron carbonitride film having the carbonitride layer and the boron nitride layer alternately stacked therein.

(Supplementary Note 27)

According to yet another aspect of the present invention, there is provided a program for causing a computer to execute: sequence (a) of supplying a gas containing an element, a carbon-containing gas and a nitrogen-containing gas to a heated substrate in a processing vessel of a substrate processing apparatus to form a carbonitride layer including the element; sequence (b) of supplying a boron-containing gas and a nitrogen-containing gas to the heated substrate in the processing vessel to form a boron nitride layer; and sequence (c) of alternately repeating sequence (a) and sequence (b) to form on the substrate a boron carbonitride film having the carbonitride layer and the boron nitride layer alternately stacked therein.

(Supplementary Note 28)

According to yet another aspect of the present invention, there is provided a computer-readable recording medium storing a program for causing a computer to execute: sequence (a) of supplying a gas containing an element, a carbon-containing gas and a nitrogen-containing gas to a heated substrate in a processing vessel of a substrate processing apparatus to form a carbonitride layer including the element; sequence (b) of supplying a boron-containing gas and a nitrogen-containing gas to the heated substrate in the processing vessel to form a boron nitride layer; and sequence (c) of alternately repeating sequence (a) and sequence (b) to form on the substrate a boron carbonitride film having the carbonitride layer and the boron nitride layer alternately stacked therein.

What is claimed is:

1. A method of manufacturing a semiconductor device, comprising:
   (a) forming a carbonitride layer including an element and having a thickness of several atomic layers by performing a first set of steps a predetermined number of times, the first set of steps including:
      (a-1) supplying a gas containing the element to a substrate to form an element-containing layer including the element;
      (a-2) supplying a carbon-containing gas to the substrate to form a carbon-containing layer on the element-containing layer to form a layer including the element and carbon, and
      (a-3) supplying a nitrogen-containing gas to the substrate to nitride the layer including the element and carbon;
   (b) forming a boron nitride layer having a thickness of less than one atomic layer by performing a second set of steps a predetermined number of times, the second set of steps including:
      (b-1) supplying a boron-containing gas to the substrate to form a boron-containing layer; and
      (b-2) supplying a nitrogen-containing gas to the substrate to nitride the boron-containing layer a predetermined number of times to form a boron nitride layer; and
   (c) alternately repeating (a) and (b) to form on the substrate a boron carbonitride film having the carbonitride layer and the boron nitride layer alternately stacked therein.

2. The method according to claim 1, wherein the element-containing layer comprises at least one layer selected from a group consisting of a continuous deposition layer of the element, a discontinuous deposition layer of the element, a continuous chemisorption layer of the gas containing the element, and a discontinuous chemisorption layer of the gas containing the element.

3. The method according to claim 1, wherein the carbon-containing layer comprises a discontinuous chemisorption layer of the carbon-containing gas.

4. The method according to claim 1, wherein the carbon-containing layer comprises a chemisorption layer of the carbon-containing gas, an adsorption state of the chemisorption layer being unsaturated state.

5. The method according to claim 1, wherein the boron-containing layer comprises a discontinuous chemisorption layer of the boron-containing gas.

6. The method according to claim 1, wherein the boron-containing layer comprises a chemisorption layer of the boron-containing gas, an adsorption state of the chemisorption layer being unsaturated state.

7. The method according to claim 1, wherein (a-3) comprises thermally nitriding the layer including the element and carbon under a condition where a nitridation reaction by the nitrogen-containing gas in the layer including the element and carbon is unsaturated.

8. The method according to claim 1, wherein (b-2) comprises thermally nitriding the boron-containing layer under a condition where a nitridation reaction by the nitrogen-containing gas in the boron-containing layer is unsaturated.

9. The method according to claim 1, wherein the element-containing layer comprises supplying the gas containing the element to the substrate under a condition where a CVD reaction occurs.

10. The method according to claim 1, wherein the element comprises a semiconductor element or a metal element.

11. The method according to claim 1, wherein the element comprises silicon.

12. The method according to claim 1, wherein the boron carbonitride film comprises SiBCN film, the carbonitride layer comprises SiCN layer, and the boron nitride layer comprises BN layer.

13. A method of manufacturing a semiconductor device, comprising:
(a) forming a carbonitride layer including an element and having a thickness of less than one atomic layer by performing a first set of steps a predetermined number of times, the first set of steps including:
 (a-1) supplying a gas containing the element to a substrate to form an element-containing layer including the element;
 (a-2) supplying a carbon-containing gas to the substrate to form a carbon-containing layer on the element-containing layer to form a layer including the element and carbon; and
 (a-3) supplying a nitrogen-containing gas to the substrate to nitride the layer including the element and carbon;
(b) forming a boron nitride layer having a thickness of several atomic layers by performing a second set of steps a predetermined number of times, the second set of steps including:
 (b-1) supplying a boron-containing gas to the substrate to form a boron-containing layer; and
 (b-2) supplying a nitrogen-containing gas to the substrate to nitride the boron-containing layer to form a boron nitride layer; and
(c) alternately repeating (a) and (b) to form on the substrate a boron carbonitride film having the carbonitride layer and the boron nitride layer alternately stacked therein.

14. The method according to claim 13, wherein the element-containing layer comprises at least one layer selected from a group consisting of a continuous deposition layer of the element, a discontinuous deposition layer of the element, a continuous chemisorption layer of the gas containing the element, and a discontinuous chemisorption layer of the gas containing the element.

15. The method according to claim 13, wherein the carbon-containing layer comprises a discontinuous chemisorption layer of the carbon-containing gas.

16. The method according to claim 13, wherein the carbon-containing layer comprises a chemisorption layer of the carbon-containing gas, an adsorption state of the chemisorption layer being unsaturated state.

17. The method according to claim 13, wherein the boron-containing layer comprises a discontinuous chemisorption layer of the boron-containing gas.

18. The method according to claim 13, wherein the boron-containing layer comprises a chemisorption layer of the boron-containing gas, an adsorption state of the chemisorption layer being unsaturated state.

19. The method according to claim 13, wherein (a-3) comprises thermally nitriding the layer including the element and carbon under a condition where a nitridation reaction by the nitrogen-containing gas in the layer including the element and carbon is unsaturated.

20. The method according to claim 13, wherein (b-2) comprises thermally nitriding the boron-containing layer under a condition where a nitridation reaction by the nitrogen-containing gas in the boron-containing layer is unsaturated.

21. The method according to claim 13, wherein the element-containing layer comprises supplying the gas containing the element to the substrate under a condition where a CVD reaction occurs.

22. The method according to claim 13, wherein the element comprises a semiconductor element or a metal element.

23. The method according to claim 13, wherein the element comprises silicon.

24. The method according to claim 13, wherein the boron carbonitride film comprises SiBCN film, the carbonitride layer comprises SiCN layer, and the boron nitride layer comprises BN layer.

* * * * *